United States Patent
Hirayama et al.

(10) Patent No.: US 8,340,230 B2
(45) Date of Patent: Dec. 25, 2012

(54) RECEIVING DEVICE, RECEIVING METHOD, AND PROGRAM

(75) Inventors: Yuichi Hirayama, Tokyo (JP); Yoshifumi Aoki, Tokyo (JP); Atsushi Makita, Tokyo (JP); Hideyuki Matsumoto, Tokyo (JP)

(73) Assignee: Sony Corporation, Tokyo (JP)

( * ) Notice: Subject to any disclaimer, the term of this patent is extended or adjusted under 35 U.S.C. 154(b) by 593 days.

(21) Appl. No.: 12/564,971

(22) Filed: Sep. 23, 2009

(65) Prior Publication Data

US 2010/0074384 A1    Mar. 25, 2010

(30) Foreign Application Priority Data

Sep. 24, 2008   (JP) ................................ P2008-244786

(51) Int. Cl.
*H04L 25/08* (2006.01)
*H04L 25/40* (2006.01)

(52) U.S. Cl. ........................................ 375/346; 375/371
(58) Field of Classification Search .................. 375/346, 375/344, 345, 371, 376; 329/307, 308; 331/1 A, 331/11
See application file for complete search history.

(56) References Cited

U.S. PATENT DOCUMENTS

| 5,815,535 | A  | * | 9/1998  | Choi et al. | 375/344 |
| 6,411,658 | B1 | * | 6/2002  | Sasaki | 375/326 |
| 6,671,339 | B1 | * | 12/2003 | Ahn | 375/346 |
| 7,623,586 | B2 | * | 11/2009 | Miyashita et al. | 375/262 |
| 7,978,795 | B2 | * | 7/2011  | Currivan et al. | 375/345 |

FOREIGN PATENT DOCUMENTS

| JP | 62-178046   | 8/1987  |
| JP | 11 355372   | 12/1999 |
| JP | 2001 345869 | 12/2001 |
| JP | 2001 358785 | 12/2001 |
| JP | 2002 152294 | 5/2002  |
| JP | 2002 247126 | 8/2002  |

* cited by examiner

*Primary Examiner* — Khai Tran
(74) *Attorney, Agent, or Firm* — Frommer Lawrence & Haug LLP; William S. Frommer; Paul A. Levy

(57) ABSTRACT

A receiving device includes: a noise detecting means for detecting a noise, which is contained in a received signal, using the received signal which has undergone clock synchronization processing: a phase error detecting means for detecting a phase error of the received signal using the received signal which has undergone clock synchronization processing; and a calculation means for calculating a phase correction value on the basis of the phase error detected by the phase error detecting means, wherein, when the noise is detected by the noise detecting means, the calculation means modifies a parameter to be employed in the calculation of the phase correction value so as to decrease the phase correction value.

15 Claims, 17 Drawing Sheets

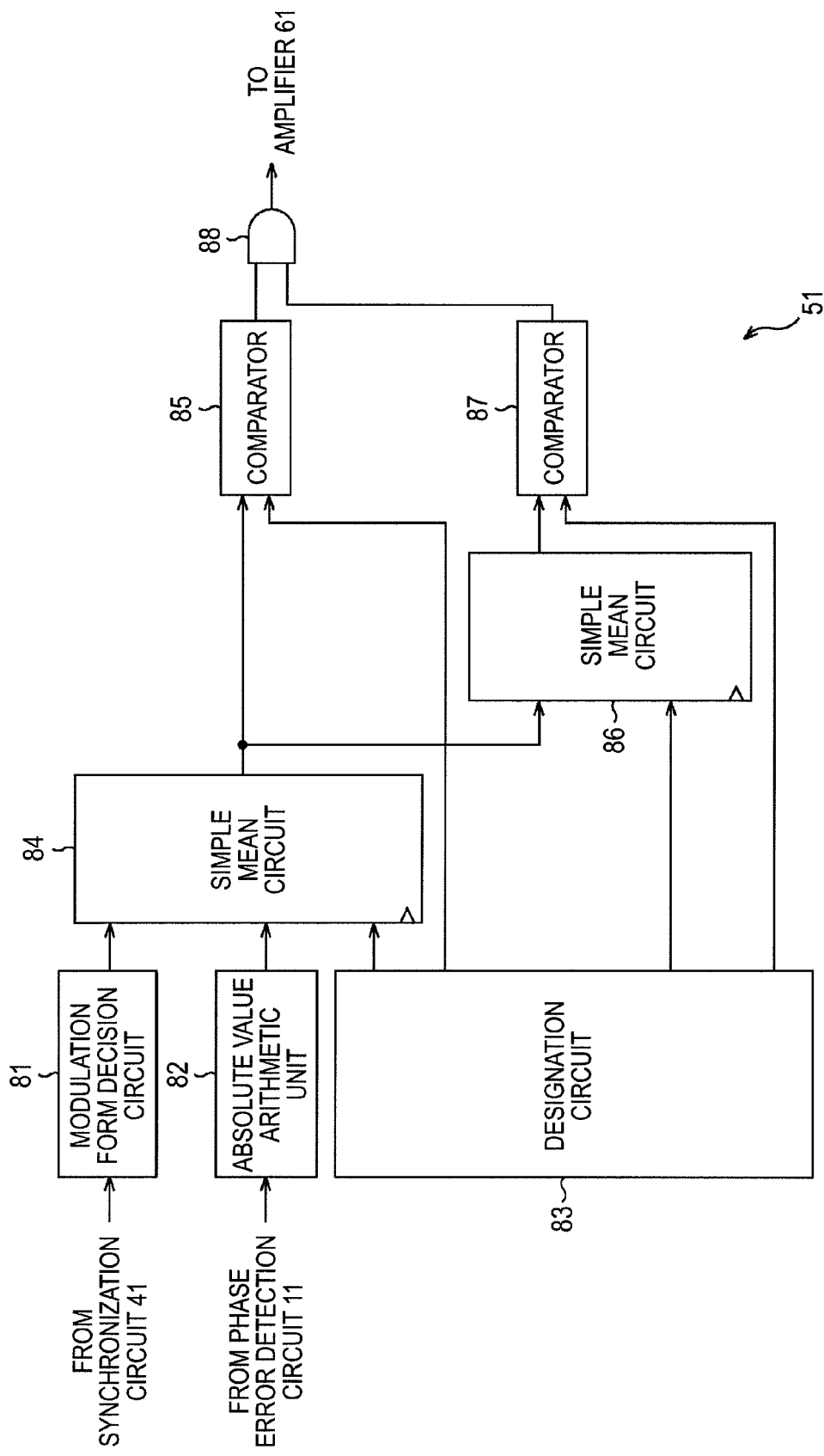

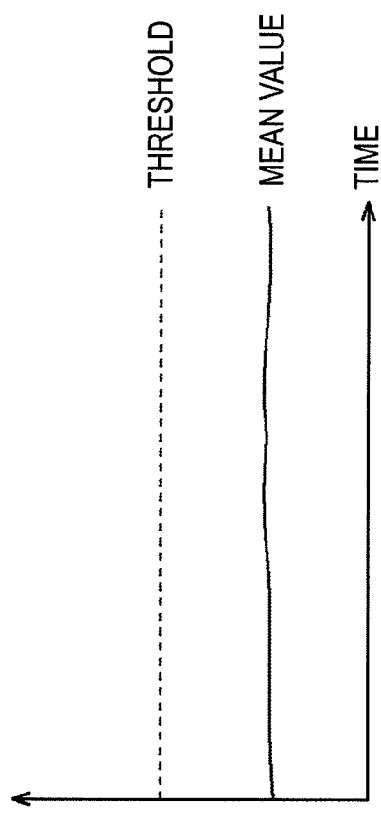
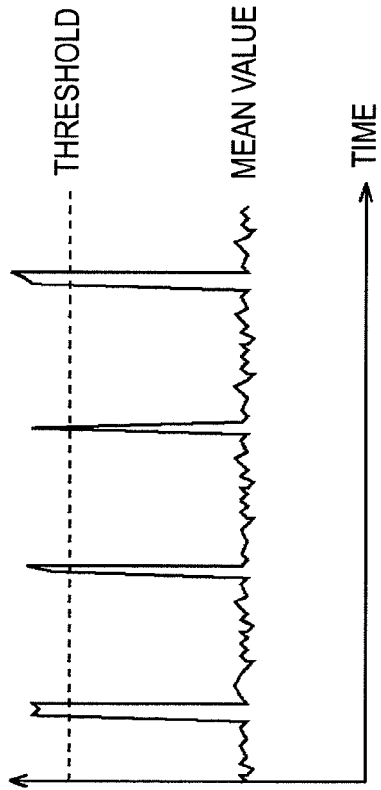

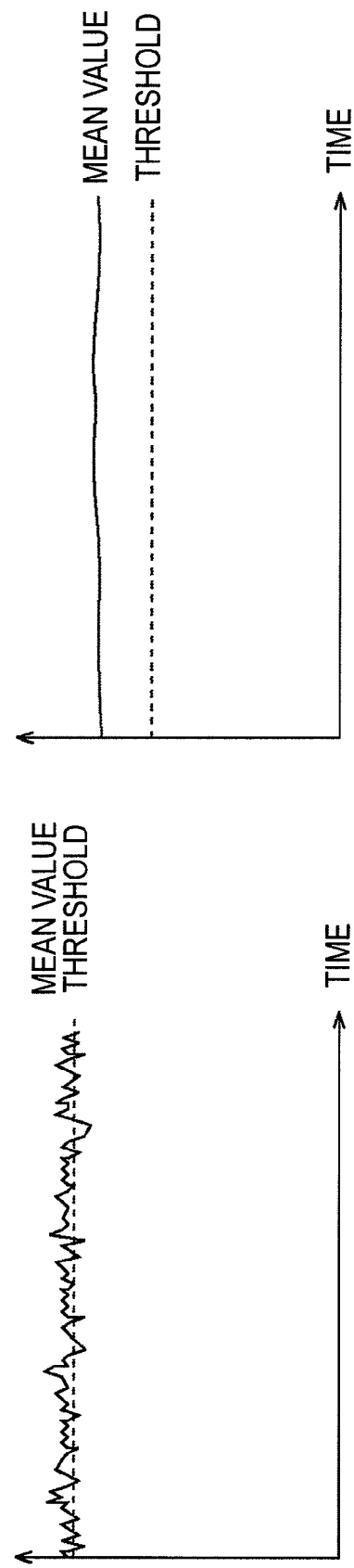

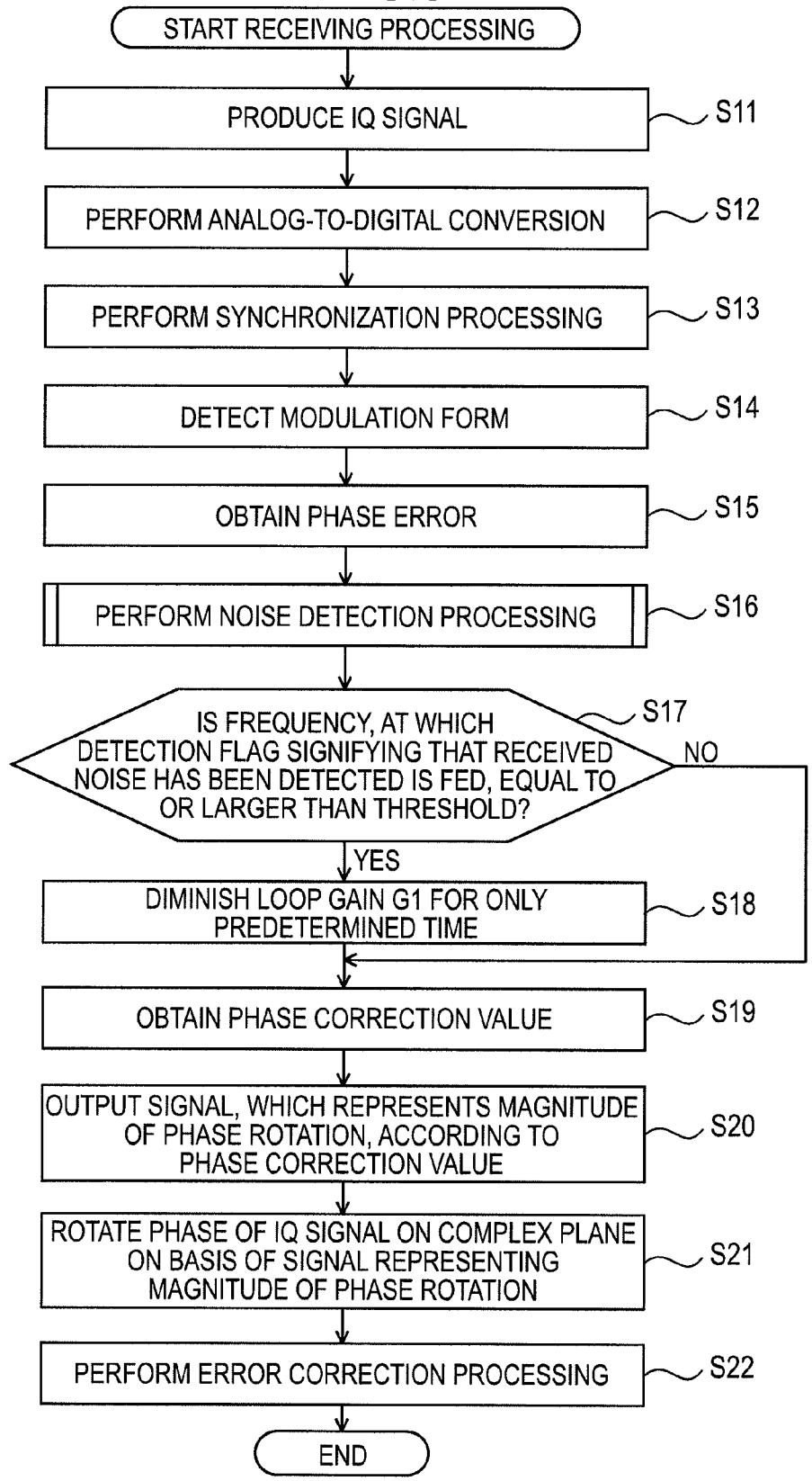

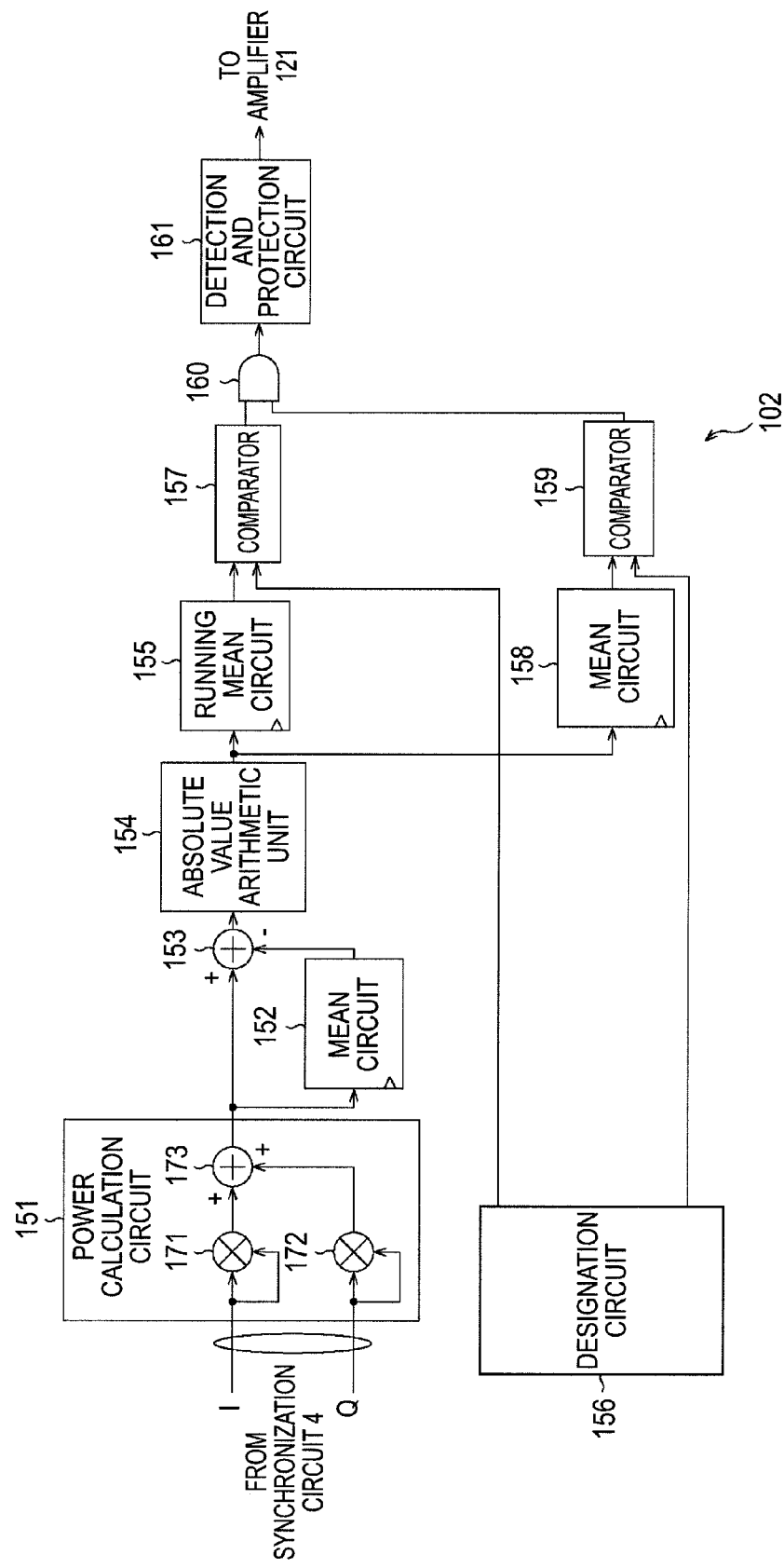

RECEIVING DEVICE, RECEIVING METHOD, AND PROGRAM

BACKGROUND OF THE INVENTION

1. Field of the Invention

The present invention relates to a receiving device, a receiving method, and a program. More particularly, the present invention is concerned with a receiving device in which when a noise is contained in a received signal, phase locking processing can be protected, a receiving method, and a program.

2. Description of the Related Art

FIG. 1 is a block diagram showing an example of the constitution of a digital broadcast receiver in accordance with a related art.

In the digital broadcast receiver shown in FIG. 1, a tuner 2 performs frequency conversion, IQ demodulation, or the like on a radiofrequency (RF) signal received at an antenna 1, and outputs a resultant IQ signal to an analog-to-digital (A/D) conversion circuit 3.

The A/D conversion circuit 3 performs analog-to-digital conversion on the IQ signal fed from the tuner 2, and outputs a digital IQ signal to a synchronization circuit 4.

The synchronization circuit 4 performs synchronization processing such as frequency synchronization processing, clock synchronization processing, or frame synchronization processing on the IQ signal fed from the A/D conversion circuit 3, and outputs a resultant IQ signal representing a symbol.

A phase locked loop (PLL) circuit 5 includes a phase error detector 11, a loop filter 12, a numerically controlled oscillator (NCO) 13, and a phase rotation circuit 14.

In the PLL circuit 5, the phase error detector 11 obtains as a phase error a deviation of a symbol from a ideal point, at which the symbol should originally be located, on the basis of the IQ signal, which represents the symbol and is fed from the synchronization circuit 4, and a signal representing a magnitude of phase rotation and being fed back from the NCO 13.

More particularly, when an IQ signal representing a known symbol is fed from the synchronization circuit 4, the phase error detector 11 uses the IQ signal, which represents the known symbol, to obtain a phase error a deviation from the ideal point at which the symbol should originally be located. When an IQ signal representing a data symbol is fed from the synchronization circuit 4, the phase error detector 11 hard decides the IQ signal representing the data symbol, and obtains the phase error on the basis of the result of hard decision and the IQ signal that has not undergone the hard detection.

The phase error detector 11 uses the obtained phase error and a signal, which represents a magnitude of phase rotation and is fed back from the NCO 13, to obtain a phase error that will be observed even after the phase error has been corrected by the phase rotation circuit 14. The phase error obtained by the phase error detector 11 is fed to a loop filter 12.

The loop filter 12 includes an amplifier 21, an amplifier 22, an arithmetic element 23, a register 24, and an arithmetic element 25. The loop filter 12 filters a phase error fed from the phase error detector 11, and controls the NCO 13, which will be described later, according to the result of the filtering.

More particularly, in the loop filter 12, a phase error is multiplied by loop gains G1 and G2 by the amplifiers 21 and 22 respectively. The resultant value is cumulated by the arithmetic element 23 and register 24. The sum of the output value of the register 24 and a value obtained by multiplying the phase error by the loop gain G1 alone is outputted as a phase correction value from the arithmetic element 25.

The NCO 13 generates a signal, which has a predetermined phase, according to the phase correction value fed from the loop filter 12, and feeds the signal as a signal, which represents the magnitude of phase rotation with respect to an ideal point of an input symbol on a complex plane, to the phase error detector 11 and the phase rotation circuit 14.

The phase rotation circuit 14 rotates the phases of the IQ signal, which represents a symbol and is fed from the synchronization circuit 4, on the complex plane on the basis of the signal representing the magnitude of phase rotation and being fed from the NCO 13, thus corrects the phase error, and outputs the resultant IQ signal.

An error correction circuit 6 performs error correction processing or the like on the IQ signal sent from the phase rotation circuit 14, and outputs the resultant signal.

A demodulation device that demodulates a signal modulated according to the quadrature phase shift keying (QPSK) technique is described in, for example, patent document 1, that is, JP-A-62-178046.

SUMMARY OF THE INVENTION

In the digital broadcast receiver shown in FIG. 1, if an impulse signal generated at the ignition timing in an automobile, a radar pulsating signal employed in air traffic control, or a burst noise is contained in a received signal, the signal (hereinafter, a received noise) may become an obstacle to reception.

More particularly, when a received noise overlaps a frequency band within which a received signal falls, it adversely affects phase locking processing. In particular, when a loop gain (loop band) to be given by the PLL circuit 5 is set to a large value, if the phase error detector 11 detects an incorrect phase error due to the adverse effect of the received noise, a signal representing a magnitude of phase rotation and being produced by the loop filter 12 and NCO 13 becomes erroneous. As a result, the phase rotation circuit 14 rotates the phase of an IQ signal according to the erroneous signal representing the magnitude of phase rotation. The phase locking processing is likely to fail. In this case, the signal produced by the loop filter and NCO remains out of phase until another IQ signal is fetched. A continuous block error occurs.

There is a need for a technology of protecting phase locking processing in a case where a noise is contained in a received signal.

According to one embodiment of the present invention, there is provided a receiving device including: a noise detecting means for detecting a noise contained in a received signal using the received signal which has undergone clock synchronization processing; a phase error detecting means for detecting a phase error of the received signal using the received signal which has undergone clock synchronization processing; and a calculation means for calculating a phase correction value on the basis of the phase error detected by the phase error detecting means. If the noise is detected by the noise detecting means, the calculation means modifies a parameter to be employed in the calculation of the phase correction value so as to decrease the phase correction value.

According to one embodiment of the present invention, there is provided a receiving method including the steps of: detecting a noise contained in a received signal using the received signal which has undergone clock synchronization processing; detecting a phase error of the received signal using the received signal which has undergone clock synchronization processing; and calculating a phase correction value on the basis of the phase error detected through the processing of the step of detecting the phase error. At the calculation step, if a noise is detected through the processing of the noise detection step, a parameter to be employed in the calculation of the phase correction value is modified in order to decrease the phase correction value.

According to one embodiment of the present invention, there is provided a program causing a computer to function as a receiving device that includes a noise detecting means for detecting a noise contained in a received signal using the received signal which has undergone clock synchronization processing, a phase error detecting means for detecting a phase error of the received signal using the received signal which has undergone clock synchronization processing, and a calculation means for calculating a phase correction value on the basis of the phase error detected by the phase error detecting means. In the receiving device, when a noise is detected by the noise detecting means, the calculation means modifies a parameter, which is employed in the calculation of the phase correction value, so as to decrease the phase correction value.

According to the embodiments of the present invention, a received signal having undergone clock synchronization processing is used to detect a noise contained in the received signal. The received signal having undergone clock synchronization processing is used to detect a phase error of the received signal. A phase correction value is calculated based on the phase error. However, when a noise is detected, a parameter employed in calculation of the phase correction value is modified in order to decrease the phase correction value.

As mentioned above, according to the embodiments of the present invention, when a noise is contained in a received signal, phase locking processing can be protected.

BRIEF DESCRIPTION OF THE DRAWINGS

FIG. 3 is a block diagram showing an example of the detailed constitution of a noise detector shown in FIG. 2;

FIGS. 4A and 4B are diagrams for use in explaining detection of a received noise in a case where a noise floor is low;

FIGS. 5A and 5B are diagrams for use in explaining detection of a received noise in a case where the noise floor is high;

FIG. 6 is a flowchart describing receiving processing to be performed in the receiver shown in FIG. 2;

FIG. 9 is a block diagram showing an example of the detailed constitution of a noise detector shown in FIG. 8;

DESCRIPTION OF THE PREFERRED EMBODIMENTS

First Embodiment

Example of the Constitution of a Receiver

Figure 2:
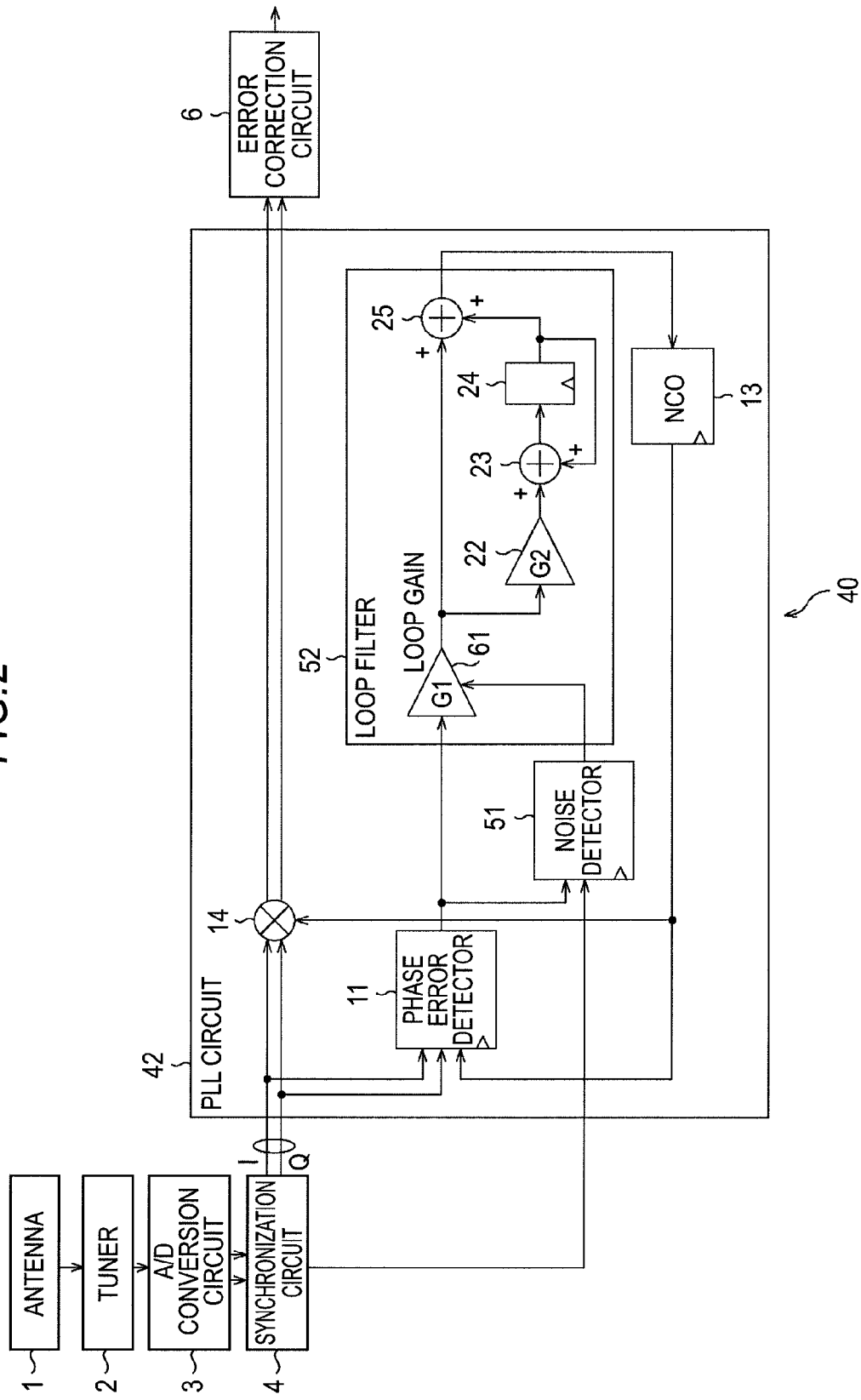
FIG. 2 is a block diagram showing an example of the constitution of the first embodiment of a receiver to which the present invention is applied.

FIG. 2 is a block diagram showing an example of the constitution of the first embodiment of a receiver to which the present invention is applied.

Figure 1:
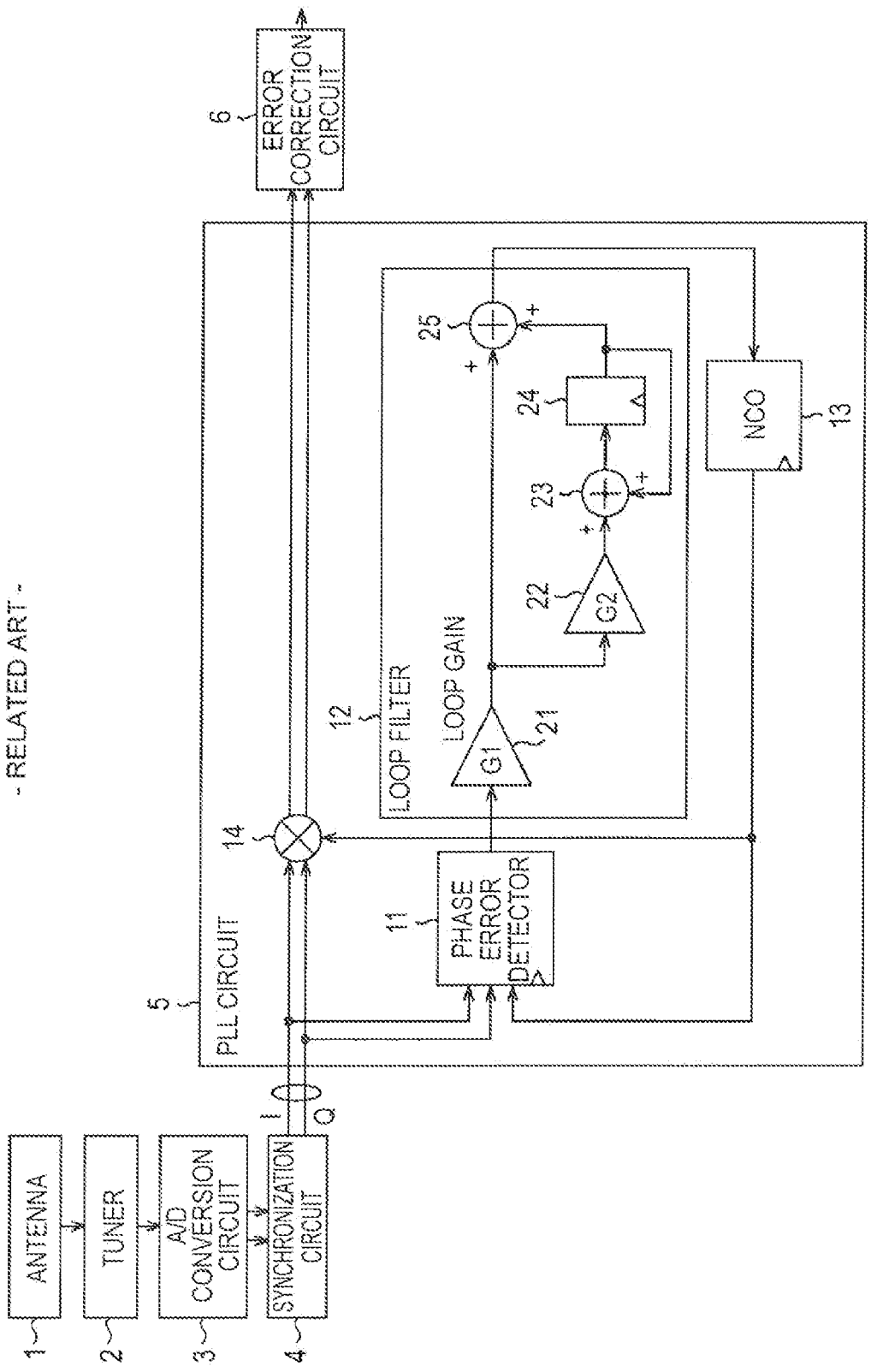
FIG. 1 is a block diagram showing an example of the constitution of a digital broadcast receiver in accordance with a related art.

In the constitution shown in FIG. 2, the same reference numerals are assigned to the same components as those included in the constitution shown in FIG. 1. An iterative description will be omitted.

The constitution of a receiver 40 shown in FIG. 2 is different from the constitution shown in FIG. 1 in a point that a noise detector 51 is included, a point that a synchronization circuit 41 is substituted for the synchronization circuit 4, and a point that an amplifier 61 is substituted for the amplifier 21.

To be more specific, in the receiver 40, the synchronization circuit 41 performs, similarly to the synchronization circuit 4 shown in FIG. 1, synchronization processing such as frequency synchronization processing, clock synchronization processing, or frame synchronization processing on an IQ signal fed from the A/D conversion circuit 3, and outputs a resultant IQ signal representing each symbol. The synchronization circuit 41 references an IQ signal, which represents a header of a frame, to detect a modulation form for each symbol, and feeds the modulation form to the noise detector 51 included in a PLL circuit 42.

The noise detector 51 is connected to the phase error detector 11 and the amplifier 61 included in a loop filter 52 (which will be described later). The noise detector 51 detects a received noise by utilizing the fact that when the received noise is contained in a received signal, a phase error gets larger than a normal one.

More particularly, the noise detector 51 detects containment of the received noise in the received signal on the basis of the phase error outputted from the phase error detector 11 and the modulation form fed from the synchronization circuit 41. The noise detector 51 feeds a detection flag, which signifies whether the received noise has been detected, to the amplifier 61. Incidentally, the noise detector 51 will be detailed with reference to FIG. 3, described later.

In the loop filter 52, the amplifier 61 modifies the loop gain G1, which is regarded as a parameter employed in calculation of a phase correction value, according to a frequency at which the detection flag signifying as a result of detection that a received noise has been detected is fed from the noise detector 51.

(Example of the Detailed Constitution of the Noise Detector)

FIG. 3 is a block diagram showing an example of the detailed constitution of the noise detector 51 in FIG. 2.

In FIG. 3, the noise detector 51 includes a modulation form decision circuit 81, an absolute value arithmetic unit 82, a designation circuit 83, simple mean circuits 84 and 86, comparators 85 and 87, and an AND circuit 88.

The modulation form decision circuit 81 decides whether the modulation form fed from the synchronization circuit 41 is a predetermined modulation form, and feeds a decision flag, which signifies the result of the decision, to the simple mean circuit 84.

The absolute value arithmetic unit 82 computes an absolute value of a phase error fed from the phase error detector 11, and feeds the absolute value to the simple mean circuit 84.

The designation circuit 83 feeds the numbers of symbols, which are stored in advance, to the simple mean circuits 84 and 86 respectively as ranges of values to be averaged by the simple mean circuits 84 and 86 respectively. The number of symbols whose relevant values are averaged by the simple mean circuit 86 is much larger than the number of symbols whose relevant values are averaged by the simple mean circuit 84. For example, the number of symbols whose relevant values are averaged by the simple mean circuit 84 ranges from several symbols to several tens of symbols, while the number of symbols whose relevant values are averaged by the simple mean circuit 86 ranges from several hundreds of symbols to several thousands of symbols. The designation circuit 83 feeds thresholds, which are employed in making a decision by the comparators 85 and 87 respectively, to the comparators 85 and 87 respectively.

The simple mean circuit 84 decides based on the decision flag, which is fed from the modulation form decision circuit 81, whether a simple mean value is calculated. Since a phase error varies depending on a modulation form, the simple mean circuit 84 calculates a simple mean value in relation to symbols to be treated in one kind of modulation form so that the mean value will be used to detect a received noise.

When a modulation form to be concerned is a modulation form for data symbols, since the majority of a transmission time is occupied by the data symbols, a received noise will not be missed. As described later, in an environment in which a phase noise is large, the received noise may be incorrectly detected.

In contrast, when a modulation form to be concerned is a modulation form for known symbols, a received noise is detected highly precisely even in an environment in which a phase noise is large. However, a ratio at which the known symbols occupy a transmission time is so limited that the received noise may be missed.

If the simple mean circuit 84 decides to calculate a simple mean value, the simple mean circuit 84 obtains a short-cycle mean value of absolute values of phase errors fed from the absolute value arithmetic unit 82. More particularly, the simple mean circuit 84 obtains a mean value of absolute values of phase errors fed from the absolute value arithmetic unit 82 in units of the number of symbols fed from the designation circuit 83.

For example, when the number of symbols fed from the designation circuit 83 is 64 symbols, the simple mean circuit 84 obtains a mean value of absolute values of phase errors of symbols inputted as the 0th to the sixty-third symbols. Thereafter, the simple mean circuit 84 obtains a mean value of absolute values of phase errors of symbols inputted as the sixty-fourth to one-hundred twenty-seventh symbols. Likewise, the simple mean circuit 84 obtains a mean value of absolute values of phase errors of symbols in units of sixty-four symbols.

The comparator 85 decides whether a mean value of absolute values of phase errors obtained by the simple mean circuit 84 is larger than the threshold fed from the designation circuit 83. If the comparator 85 decides that the mean value of absolute values of phase errors is larger than the threshold, the comparator 85 detects a peak of a variation among the phase errors, and feeds a peek detection signal to the AND circuit 88.

The simple mean circuit 86 obtains a mean value of mean values of absolute values of phase errors, which are obtained by the simple mean circuit 84, in units of a number of symbols, fed from the designation circuit 83, larger than the number of symbols used the simple mean circuit 84. Thus, the simple mean circuit 86 obtains a mean value of absolute values of phase errors at intervals of a longer cycle than the simple mean circuit 84 does. The mean value demonstrates the noise floor for the phase errors.

The comparator 87 decides whether a mean value of absolute values of phase errors obtained by the simple mean circuit 86 is smaller than the threshold fed from the designation circuit 83. When the comparator 87 decides that the mean value of the absolute values of phase errors is smaller than the threshold, that is, when the noise floor is low, the comparator 87 feeds a validation signal to the AND circuit 88 so as to validate the peak detection signal.

In contrast, when the comparator 87 decides that the mean value of the absolute values of phase errors is equal to or larger than the threshold, that is, when the noise floor is high, the comparator 87 does not feed the validation signal to the AND circuit 88 so as to invalidate the peak detection signal.

When the peak detection signal is fed from the comparator 85 and the validation signal is fed from the comparator 87, the AND circuit 88 detects that a received noise is contained in a received signal, and feeds as a result of detection a detection flag, which signifies that the received noise has been found, to the amplifier 61. In any other case, the AND circuit 88 feeds as the result of detection a detection flag, which signifies that the received noise has not been found, to the amplifier 61.

Referring to FIGS. 4A and 4B and FIGS. 5A and 5B, detection of a received noise by the noise detector 51 will be described below.

Referring to FIGS. 4A and 4B, a description will be made of a case where a noise floor is low.

Assuming that the noise floor is low, that is, a phase noise is small, a mean value of absolute values of phase errors obtained by the simple mean circuit 84, as shown in FIG. 4A, larger than the threshold only at a time at which the mean value becomes outstanding to peak. Therefore, once the comparator 85 detects that the mean value of absolute values of phase errors obtained by the simple mean circuit 84 is larger than the threshold, the comparator 85 can accurately detect a received noise.

In this case, a mean value of absolute values of phase errors obtained by the simple mean circuit 86 is, as shown in FIG. 4B, relatively small. Therefore, when the mean value of absolute values of phase errors obtained by the simple mean circuit 86 is smaller than the threshold, the comparator 87 decides that the noise floor is low and validates the peak detection signal produced by the comparator 85. Thus, assuming that the noise floor is low and a received noise can be accurately detected, a result of detection performed by the comparator 85 is regarded as a result of detection of the received noise. A detection flag signifying the result of detection is outputted to the amplifier 61.

Next, referring to FIGS. 5A and 5B, a description will be made of a case where the noise floor is high.

Assuming that the noise floor is high, that is, the phase noise is large, the mean value of absolute values of phase errors obtained by the simple mean circuit 84 is, as shown in FIG. 5A, larger than the threshold at almost all times. Therefore, even if the mean value of absolute values of phase errors obtained by the simple mean circuit 84 is larger than the threshold, the mean value is not a peak value caused by a received noise but may be derived from a phase noise or the like. As a result, the comparator 85 may incorrectly detect the variation among phase errors, which is caused by the phase noise or the like, as a peak of the variation among phase errors caused by the received noise.

In this case, the mean value of absolute values of phase errors obtained by the simple mean circuit 86 is, as shown in FIG. 5B, relatively large. Therefore, when the mean value of absolute values of phase errors obtained by the simple mean circuit 86 is equal to or larger than the threshold, the comparator 85 decides that the noise floor is high and invalidates the peak detection signal produced by the comparator 85. Thus, when the noise floor is high, if there is a possibility that a received noise may be incorrectly detected, a result of detection by the comparator 85 is invalidated. As the result of detection, a detection flag signifying that the received noise has not been detected is outputted to the amplifier 61.

(Actions to be Performed in the Receiver)

Next, actions to be performed in the receiver 40 having the foregoing constitution will be described below.

To begin with, referring to the flowchart of FIG. 6, receiving processing to be performed in the receiver 40 will be described below.

Pieces of processing of respective steps are not always performed in ascending numerical order but may be performed in parallel with processing of any other step or inversely to processing of any other step.

At step S11, the tuner 2 performs frequency conversion, IQ demodulation, or the like on a radiofrequency signal received at the antenna 1 so as to produce an IQ signal.

At step S12, the A/D conversion circuit 3 performs analog-to-digital conversion on the IQ signal produced by the tuner 2, and outputs a digital IQ signal to the synchronization circuit 41.

At step S13, the synchronization circuit 41 performs frequency synchronization processing, clock synchronization processing, frame synchronization processing, or the like on the IQ signal fed from the A/D conversion circuit 3, and outputs a resultant IQ signal that represents each symbol.

At step S14, the synchronization circuit 41 references an IQ signal, which represents a header of a frame, to detect a modulation form for the symbol, and feeds the modulation form to the noise detector 51 in the PLL circuit 42.

At step S15, the phase error detector 11 obtains a deviation of each symbol from an ideal point, at which the symbol should originally be located, on the basis of the IQ signal, which is fed from the synchronization circuit 41 and represents the symbol, and a signal that represents a magnitude of phase rotation and is fed back from the NCO 13.

At step S16, the noise detector 51 performs noise detection processing so as to detect a received noise. The noise detection processing will be detailed with reference to the flowchart of FIG. 7 later.

At step S17, the amplifier 61 in the loop filter 52 decides whether the frequency at which the detection flag signifying that a received noise has been detected is fed from the noise detector 51 is equal to or larger than the threshold. For example, the amplifier 61 counts the number of times at which the detection flag signifying that the received noise has been detected is fed, and decides whether the count value is equal to or larger than the threshold.

If the amplifier 61 decodes at step S17 that the frequency at which the detection flag signifying that a received noise has been detected is fed from the noise detector 51 is equal to or larger than the threshold, the amplifier 61 diminishes the loop gain G1 at step S18 for only a relatively long predetermined time so as to decrease a phase correction value. Namely, the amplifier 61 degrades the sensitivity in detecting a phase error for only the predetermined time.

Thus, a signal representing a magnitude of phase rotation and being outputted from the NCO 13 becomes unsusceptible to a received noise, and phase locking processing is protected. As a result, the phase locking processing does not fail but demodulation and synchronization processing is stably carried out. After the processing of step S18 is completed, the process proceeds to step S19.

In contrast, if a decision is made at step S17 that the frequency at which the detection flag signifying that a received noise has been detected is fed from the noise detector 51 is not equal to or larger than the threshold, the processing of step S18 is skipped and the process proceeds to step S19.

At step S19, the loop filter 52 obtains a phase correction value. More particularly, the amplifiers 61 and 22 in the loop filter 52 multiply a phase error by the loop gains G1 and G2 respectively, and the arithmetic element 23 and register 24 cumulate the resultant value. The arithmetic element 25 obtains as the phase correction value the sum of the output value of the register 24 and a value that is obtained by multiplying the phase error by the loop gain G1 alone.

At step S20, the NCO 13 generates a signal, which has a predetermined phase, according to the phase correction value obtained by the loop filter 52, and outputs the signal to the phase error detector 11 and phase rotation circuit 14 as a signal representing a magnitude of phase rotation relative to an ideal point of an input symbol on a complex plane.

At step S21, the phase rotation circuit 14 rotates the phase of an IQ signal, which represents each symbol and is fed from the synchronization circuit 41, on the complex plane on the basis of the signal representing the magnitude of phase rotation and being sent from the NCO 13, thus corrects the phase error, and outputs the resultant IQ signal.

At step S22, the error correction circuit 6 performs error correction processing or the like on the IQ signal sent from the phase rotation circuit 14, and outputs a resultant signal.

The foregoing process is repeated by the receiver 40 during signal reception.

Figure 7:
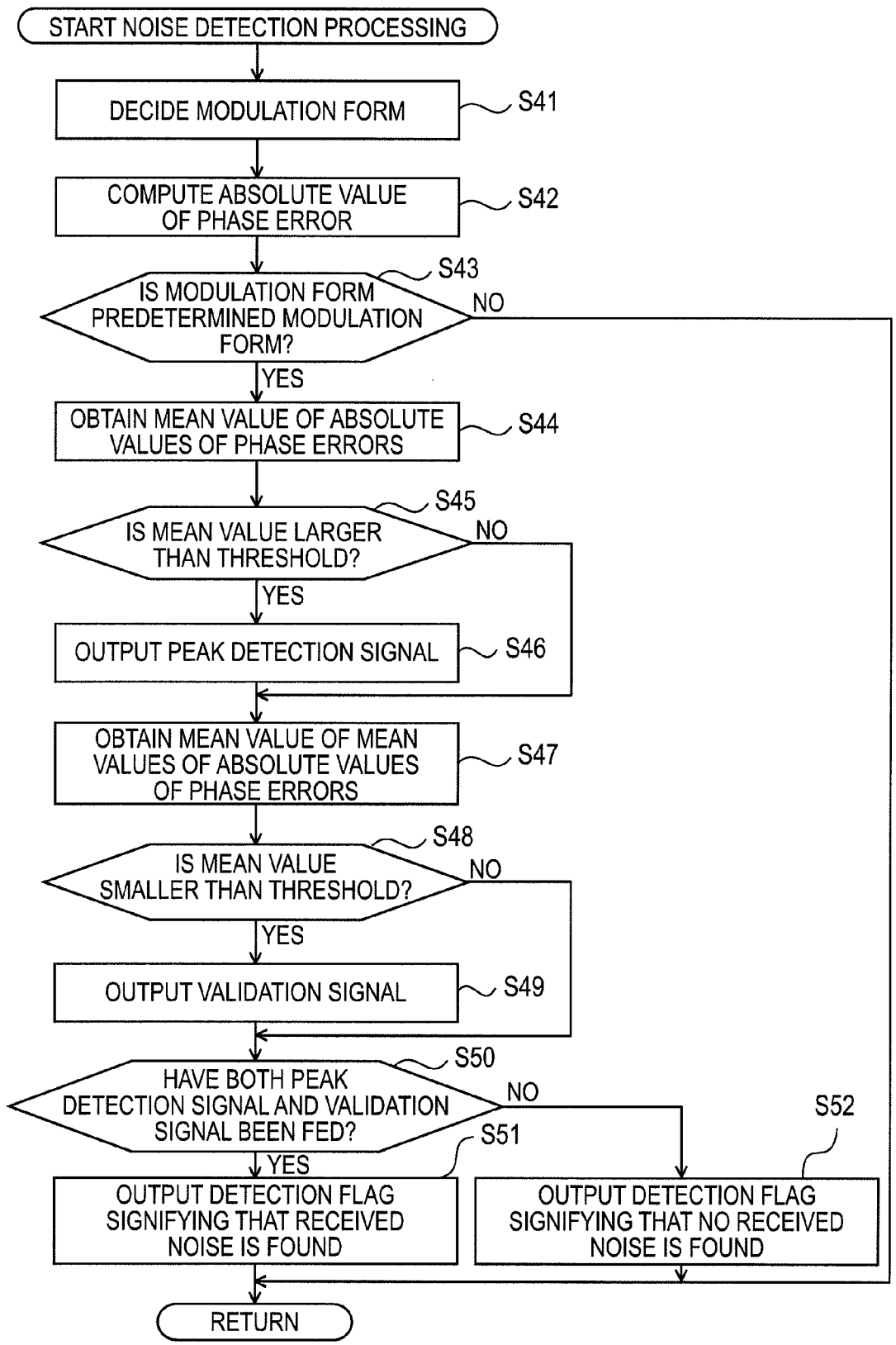
FIG. 7 is a flowchart describing noise detection processing to be performed at step S16 in FIG. 6.

Next, referring to the flowchart of FIG. 7, noise detection processing of step S16 in FIG. 6 will be described below. Incidentally, the number of symbols and the thresholds shall be fed from the designation circuit 83 to the simple mean circuits 84 and 86 and the comparators 85 and 87 at the beginning of signal reception.

At step S41, the modulation form decision circuit 81 in the noise detector 51 (FIG. 3) decides whether a modulation form fed from the synchronization circuit 41 is a predetermined modulation form, and feeds a decision flag, which signifies the result of decision, to the simple mean circuit 84.

At step S42, the absolute value arithmetic unit 82 computes an absolute value of a phase error fed from the phase error detector 11, and feeds the absolute value to the simple mean circuit 84.

At step S43, the simple mean circuit 84 decides based on the decision flag, which is fed from the modulation form decision circuit 81, whether the modulation form is the predetermined modulation form. If the simple mean circuit 84 decides at step S43 that the modulation form is not the predetermined form, the simple mean circuit 84 decides not to calculate a simple mean but terminates noise detection processing. The process then proceeds to step S17 in FIG. 6.

In contrast, if the simple mean circuit 84 decides at step S43 that the modulation form is the predetermined modulation form, the simple mean circuit 84 decides to calculate a simple mean. The process proceeds to step S44. At step S44, the simple mean circuit 84 obtains a mean value of absolute values of phase errors, which are fed from the absolute value arithmetic unit 82, in units of the number of symbols fed from the designation circuit 83.

At step S45, the comparator 85 decides whether the mean value of the absolute values of phase errors, which is obtained by the simple mean circuit 84, is larger than the threshold fed from the designation circuit 83. If the comparator 85 decides at step S45 that the mean value of the absolute values of phase errors is larger than the threshold, the comparator 85 outputs a peak detection signal to the AND circuit 88 at step S46. The process then proceeds to step S47.

In contrast, if a decision is made at step S45 that the mean value of the absolute values of phase errors is not larger than the threshold, the processing of step S46 is skipped. The process proceeds to step S47.

At step S47, the simple mean circuit 86 obtains the mean value of the means values of absolute values of phase errors, which are obtained by the simple mean circuit 84, in units of the number of symbols fed from the designation circuit 83.

At step S48, the comparator 87 decides whether the mean value of the mean values of absolute values of phase errors, which is obtained by the simple mean circuit 86, is smaller than the threshold fed from the designation circuit 83. If the comparator 87 decides at step S48 that the mean value of the mean values of absolute values of phase errors is smaller than the threshold, the comparator 87 outputs a validation signal to the AND circuit 88 at step S49. The process then proceeds to step S50.

In contrast, if a decision is made at step S48 that the mean value of the mean values of absolute values of phase errors is not smaller than the threshold, the processing of step S49 is skipped. The process then proceeds to step S50.

At step S50, the AND circuit 88 decides whether the peak detection signal is fed from the comparator 85 and the validation signal is fed from the comparator 87. If the AND circuit 88 decides at step S50 that both the peak detection signal and validation signal have been fed, the AND circuit 88 outputs a detection flag, which signifies that a received noise has been found, to the amplifier 61 at step S51. Noise detection processing is then terminated. The process proceeds to step S17 in FIG. 6.

If the AND circuit 88 decides at step S50 that the peak detection signal has been fed but the validation signal has not been fed, the AND circuit 88 outputs a detection flag, which signifies that no received noise has been found, to the amplifier 61. Noise detection processing is then terminated, and the process proceeds to step S17 in FIG. 6.

In the above description, the threshold to be used by the comparator 85 is a predetermined threshold stored in advance in the designation circuit 83. The threshold may be varied depending on a noise floor.

Second Embodiment

Example of the Constitution of a Receiver

Figure 8:
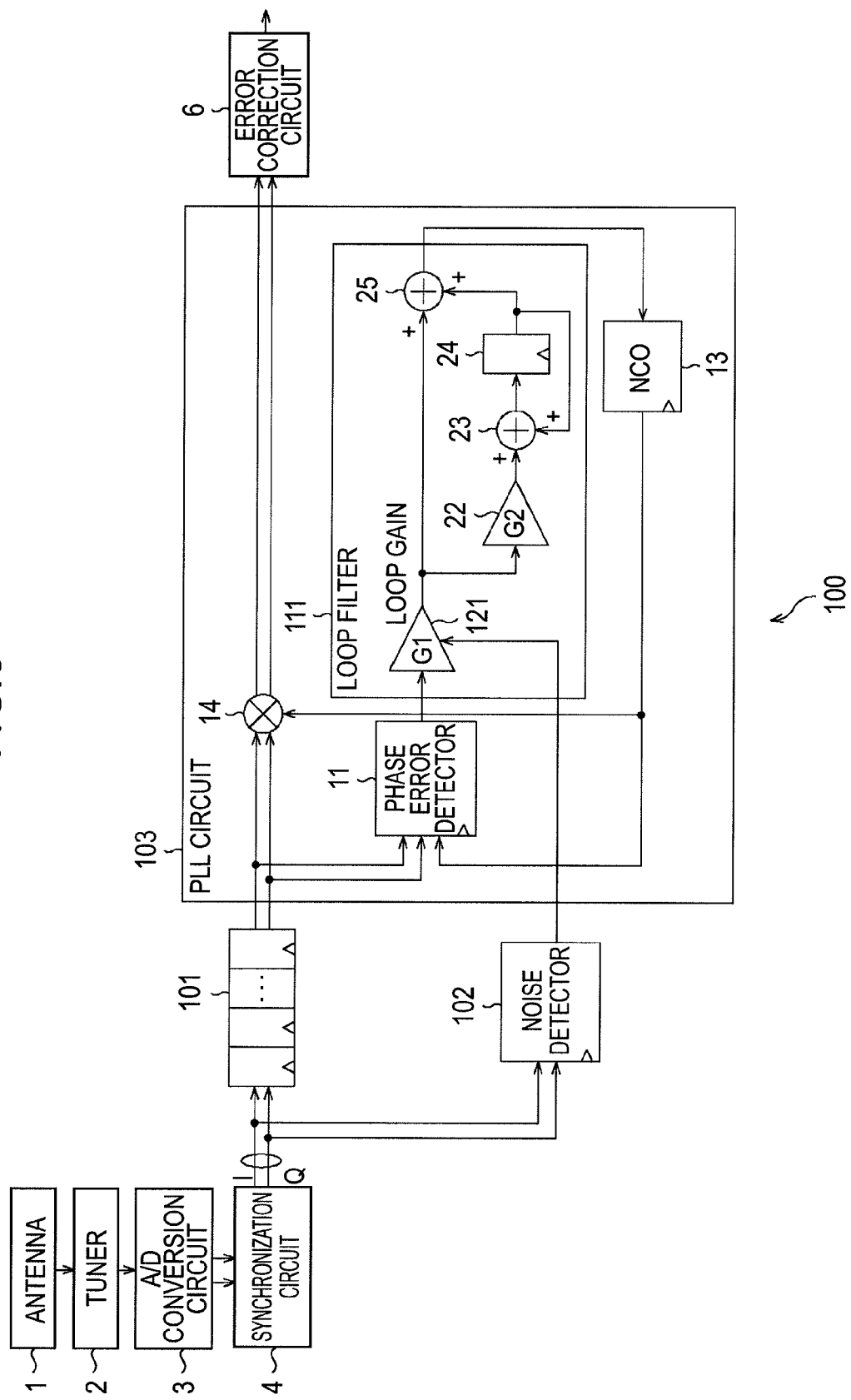
FIG. 8 is a block diagram showing an example of the constitution of the second embodiment of the receiver to which the present invention is applied.

FIG. 8 is a block diagram showing an example of the constitution of the second embodiment of a receiver to which the present invention is applied.

In the constitution shown in FIG. 8, the same reference numerals are assigned to components identical to those included in the constitution shown in FIG. 1. An iterative description will be omitted.

The constitution of a receiver 100 shown in FIG. 8 is different from the constitution shown in FIG. 1 in a point that a first-in first-out (FIFO) memory 101 and a noise detector 102 are included and a point that an amplifier 121 is substituted for the amplifier 21.

To be more specific, in the receiver 100, the FIFO memory 101 is interposed between the synchronization circuit 4 and the phase error detector 11 included in the PLL circuit 103. The FIFO memory 101 is used to delay an IQ signal fed from the synchronization circuit 4, and the delayed IQ signal is fed to the phase error detector 11. A delay time to be given in the FIFO memory 101 is designated so that a detection flag fed from the noise detector 102 and a phase error fed from the phase error detector 11 will be simultaneously inputted to the amplifier 121.

The noise detector 102 is connected to each of the synchronization circuit 4 and the amplifier 121 included in a loop filter 111, and detects a received noise by utilizing the fact that when a received signal contains a received noise, the power of an IQ signal having undergone clock synchronization processing preceding phase synchronization processing is greatly deviated from a mean power.

More particularly, the noise detector 102 obtains the power of an IQ signal fed from the synchronization circuit 4, and uses the power to detect a received noise. The noise detector 102 feeds a detection flag, which signifies whether the received signal has been found, to the amplifier 121. The noise detector 102 will be detailed later with reference to FIG. 9.

In the loop filter 111, the amplifier 121 modifies the loop gain G1, which is given during the duration of a symbol that exhibits a phase error inputted together with a detection flag, according to the detection flag that is fed from the noise detector 102 and that signifies as a result of detection that a received noise has been detected.

As mentioned above, in the receiver 100, since the noise detector 102 is disposed in a stage preceding the phase error detector 11, when an IQ signal is delayed in the FIFO memory 101, the loop gain G1 can be diminished in relation to a phase error of a symbol having a received noise detected therein by the noise detector 102. Therefore, if the amplifier 121 diminishes the loop gain G1 during only the duration of the symbol having the received noise detected therein, phase locking processing can be prevented from failing.

In the receiver 100, since the power of an IQ signal is used to detect a received noise, even when a phase noise is large, the received noise can be detected and phase locking processing can be protected.

(Example of the Detailed Constitution of the Noise Detector)

FIG. 9 is a block diagram showing an example of the detailed constitution of the noise detector 102 shown in FIG. 8.

In FIG. 9, the noise detector 102 includes a power calculation circuit 151, a mean circuit 152, an arithmetic element 153, an absolute value arithmetic unit 154, a running mean circuit 155, a designation circuit 156, comparators 157 and 159, a mean circuit 158, an AND circuit 160, and a detection and protection circuit 161.

The power calculation circuit 151 includes arithmetic elements 171 to 173, and calculates the power of an IQ signal representing each symbol. More particularly, the arithmetic element 171 multiplies an I component of an IQ signal, which represents a symbol, by the I component, and the arithmetic element 172 multiples a Q component of the IQ signal by the Q component. The arithmetic element 173 adds the result of the multiplication performed by the arithmetic element 171 and the result of the multiplication performed by the arithmetic element 172, and feeds the resultant power of the symbol to the mean circuit 152 and arithmetic element 153.

The mean circuit 152 is formed with an infinite impulse response (IIR) filter or the like. The mean circuit 152 obtains a mean value of the powers fed from the arithmetic element 173 in units of several thousands of symbols, and feeds the mean value to the arithmetic element 153.

The arithmetic element 153 subtracts the mean value, which is fed from the mean circuit 152, from the power of each symbol fed from the arithmetic element 173, and thus obtains the difference of the power of each symbol from the mean value. The absolute value arithmetic unit 154 obtains an absolute value of the difference obtained by the arithmetic element 153 (hereinafter, a power difference absolute value), and feeds the absolute value to the running mean circuit 155 and mean circuit 158.

The running mean circuit 155 obtains a running mean value of power difference absolute values fed from the absolute value arithmetic unit 154. For example, for obtaining the running mean of values relevant to four symbols, the running mean circuit 155 obtains as the running mean value a mean value of power difference absolute values of symbols inputted as the first to fourth symbols, and then obtains as the running mean value a mean value of power difference absolute values of symbols inputted as the second to fifth symbols. Likewise, a mean value of power difference absolute values of four symbols is obtained by shifting four symbols by one symbol, and regarded as the running mean value.

The designation circuit 156 feeds a threshold for the comparator 157, which is stored in advance, to the comparator 157, and feeds a threshold for the comparator 159 to the comparator 159.

The comparator 157 decides whether the running mean value obtained by the running mean circuit 155 is larger than the threshold fed from the designation circuit 156. If the comparator 157 decides that the running mean value is larger than the threshold, the comparator 157 detects a peak of a deviation from the mean power, and feeds a peak detection signal to the AND circuit 160.

The mean circuit 158 is formed with an IRR filter or the like, and obtains a mean value of power difference absolute values, which are fed from the absolute value arithmetic unit 154, in units of several thousands of symbols. The mean value of power difference absolute values demonstrates a constant variation among the amplitudes of powers.

The comparator 159 decides whether the mean value of power difference absolute values obtained by the mean circuit 158 is smaller than the threshold fed from the designation circuit 156. If the comparator 159 decides that the mean value of power difference absolute values is smaller than the threshold, that is, if the variation among the amplitudes of powers is constantly small, the comparator 159 feeds a validation signal to the AND circuit 160 so as to validate the peak detection signal.

In contrast, if the comparator 159 decides that the mean value of power difference absolute values is equal to or larger than the threshold, that is, if the variation among the amplitudes of powers is constantly large, the comparator 159 does not feed the validation signal to the AND circuit 160 and thus invalidates the peak detection signal.

If the peak detection signal is fed from the comparator 157 and the validation signal is fed from the comparator 159, the AND circuit 160 detects that a received noise is contained in a received signal, and outputs a detection pulse.

The detection and protection circuit 161 restricts the frequency at which the detection pulse is fed from the AND circuit 160, and extends the pulse duration of the detection pulse. The detection and protection circuit 161 outputs a resultant signal to the amplifier 121 as a detection flag signifying the result of detection. The duration of the detection pulse serving as the detection flag indicates a result of detection signifying that a received noise has been found, and a duration other than the detection pulse duration indicates a result of detection signifying that no received noise has been found.

As mentioned above, the detection and protection circuit 161 restricts the frequency at which the detection pulse is fed. Therefore, when the amplitude of a power varies at a frequency within a range, within which the variation is not manifested in relation to the mean value of power difference absolute values, in the same manner as a parasitic oscillation occurs at a frequency, an adverse effect of incorrect detection of a received noise can be alleviated.

Next, referring to FIG. 10A to FIG. 12, detection of a received noise by the noise detector 102 will be described below.

To begin with, referring to FIG. 10A and FIG. 10B, an IQ signal outputted from the synchronization circuit 4 will be described below.

Figure 10A:
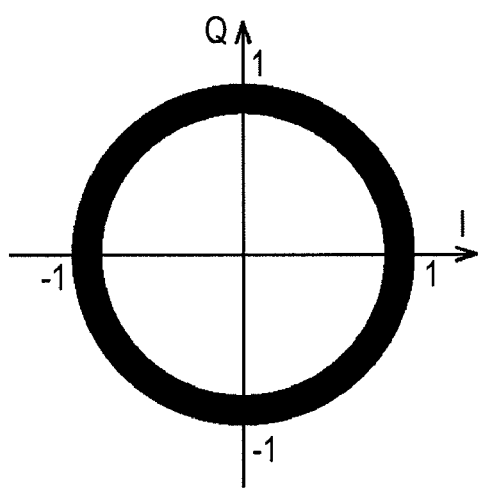
FIGS. 10A and 10B are diagrams for use in explaining an IQ signal to be outputted from a synchronization circuit.
Figure 10B:
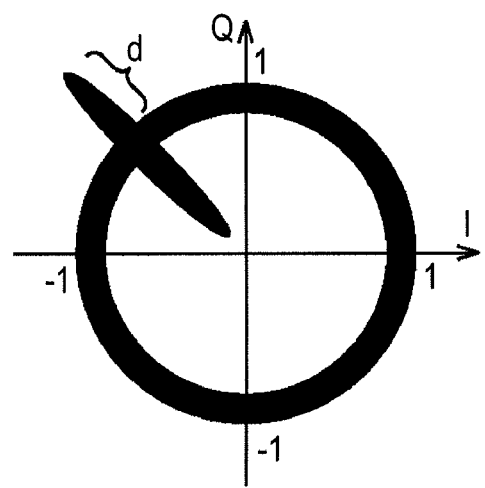

As shown in FIG. 10A, when no received noise is contained in a received signal, an IQ signal has the components thereof plotted on a unit circuit on a complex plane. In contrast, when a received noise is contained in the received signal, the components of the IQ signal are plotted on a unit circuit, a portion of which representing the received noise is projected, on the complex plane. Therefore, in this case, the arithmetic element 153 obtains the shortest distance of the portion, which projects from the unit circle, from the unit circle (for example, a distance d in the drawing) as a difference of the power of the received noise from a mean value.

Figure 11B:
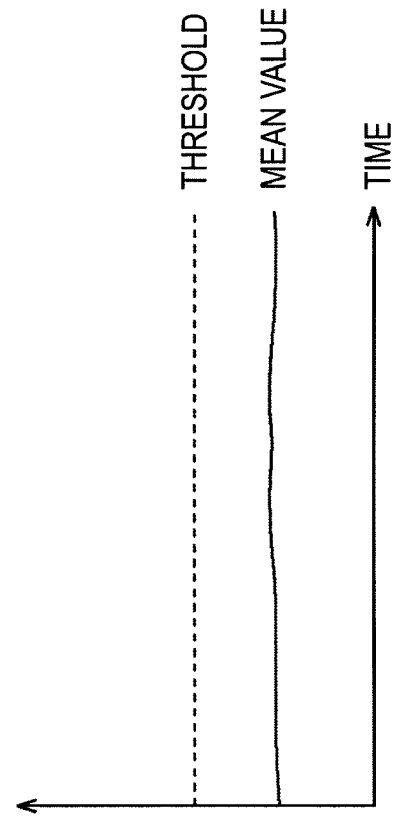
FIG. 11A and FIG. 11B are diagrams for use in explaining detection of a received noise in a case where a constant variation in the amplitude of power is small.
Figure 11A:
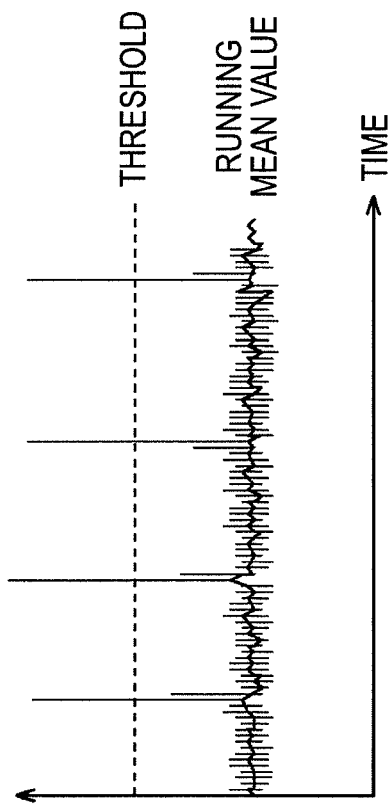

Referring to FIG. 11A and FIG. 11B, detection of a received noise in a case where the constant variation among the amplitudes of powers of IQ signals is small will be described below.

If the constant variation among the amplitudes of powers of IQ signals is small, that is, if the signal-to-noise ratios of received signals are high, the running mean value of power difference absolute values obtained by the running mean circuit 155 is, as shown in FIG. 11A, larger than the threshold only at a time at which the variation becomes outstanding to peak. Therefore, the comparator 157 can accurately detect a received noise by detecting the fact that the running mean value of power difference absolute values obtained by the running mean circuit 155 is larger than the threshold.

In this case, as shown in FIG. 11B, the mean value of power difference absolute values obtained by the mean circuit 158 is relatively small. Therefore, when the mean value of power difference absolute values obtained by the mean circuit 158 is smaller than the threshold, the comparator 159 decides that the constant variation among the amplitudes of powers of IQ signals is small, and validates the peak detection signal produced by the comparator 157. Therefore, when the constant variation among the amplitudes of powers of IQ signals is so small that a received noise can be accurately detected, a result of detection performed by the comparator 157 is regarded as a result of detection of the received noise.

Next, referring to FIG. 12A and FIG. 12B, a description will be made of a case where the constant variation among the amplitudes of powers of IQ signals is large.

Figure 12B:
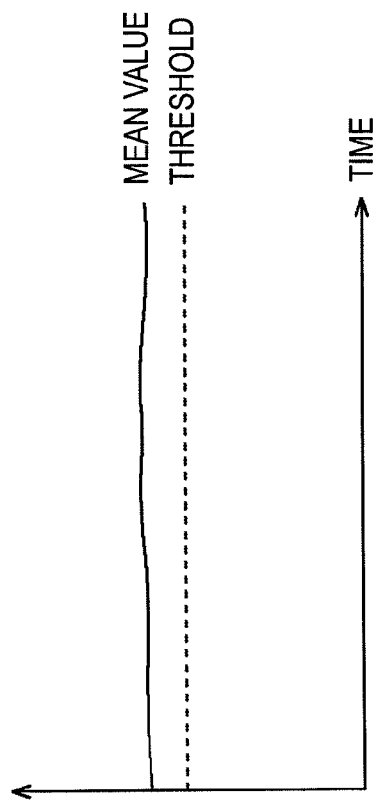
FIG. 12A and FIG. 12B are diagrams for use in explaining detection of a received noise in a case where the constant variation in the amplitude of power is large.
Figure 12A:
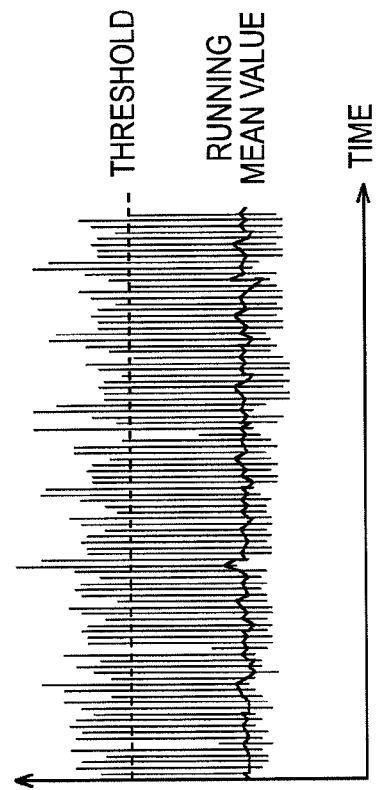

If the constant variation among the amplitudes of powers of IQ signals is large, that is, if the signal-to-noise ratios of received signals are low, the running mean value of power difference absolute values obtained by the running mean circuit 155 is, as shown in FIG. 12A, larger than the threshold at almost all times. Therefore, even when the running mean value of power difference absolute values obtained by the running mean circuit 155 is larger than the threshold, the running mean value may not reflect a peak value of the variation derived from a received noise. As a result, the comparator 157 may incorrectly detect a deviation from a mean power, which is not derived from the received noise, as the peak of the deviation from the mean power derived from the received noise.

In this case, as shown in FIG. 12B, the mean value of power difference absolute values obtained by the mean circuit 158 is relatively large. Therefore, when the mean value of power difference absolute values obtained by the mean circuit 158 is equal to or larger than the threshold, the comparator 159 decides that the constant variation among the amplitudes of powers of IQ signals is large, and invalidates the peak detection signal produced by the comparator 157. Therefore, when the constant variation among the amplitudes of powers of IQ signals is so large that a received noise may be incorrectly detected, the result of detection performed by the comparator 157 is invalidated and no detection pulse is outputted to the detection and protection circuit 161.

(Actions to be Performed in the Receiver)

Next, actions to be performed in the receiver 100 having the foregoing constitution will be described below.

To begin with, referring to the flowchart of FIG. 13, receiving processing to be performed in the receiver 100 will be described below.

Figure 13:
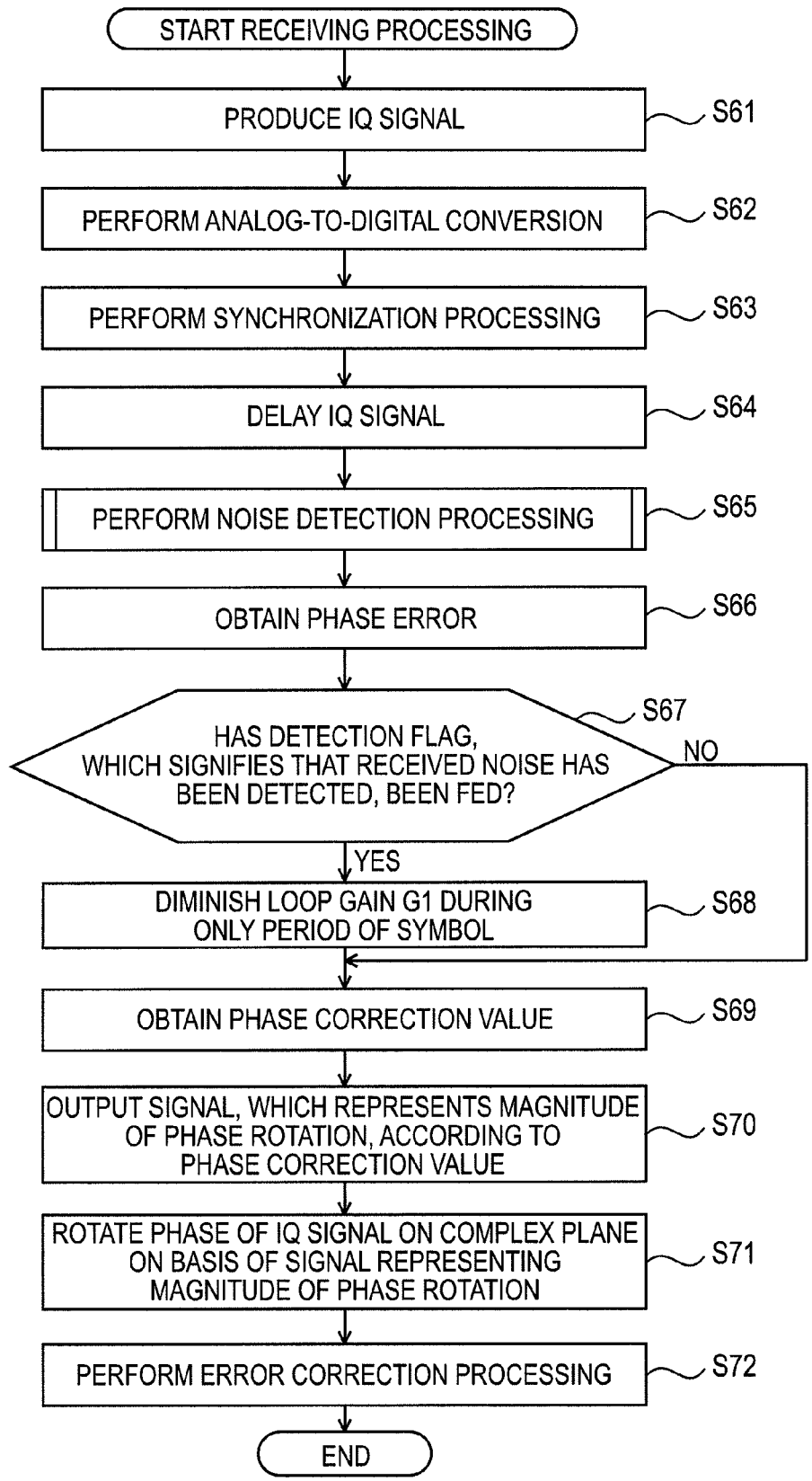
FIG. 13 is a flowchart describing receiving processing to be performed in the receiver shown in FIG. 8.

Pieces of processing of steps S61 to S63 in FIG. 13 are identical to those of steps S11 to S13 in FIG. 6. An iterative description will be omitted.

At step S64, an IQ signal fed from the synchronization circuit 4 is delayed in the FIFO memory 101. At step S65, the noise detector 102 performs noise detection processing, that is, uses the IQ signal fed from the synchronization circuit 4 to detect a noise. The noise detection processing will be detailed later with reference to the flowchart of FIG. 14.

At step S66, the phase error detector 11 obtains as a phase error a deviation of a symbol from an ideal point, at which the symbol should originally be located, on the basis of an IQ signal, which is delayed in the FIFO memory 101 and represents the symbol, and a signal which represents a magnitude of phase rotation and is fed from the NCO 13.

At step S67, the amplifier 121 in the loop filter 111 decides whether the detection flag signifying that a received noise has been detected is fed from the noise detector 102. If the amplifier 121 decides at step S67 that the detection flag signifying that a received noise has been detected is fed, the amplifier 121 diminishes at step S68 the loop gain G1 for only the period of a current symbol so as to decrease the sensitivity in detecting a phase error.

Accordingly, the signal representing the magnitude of phase rotation and being outputted from the NCO 13 is unsusceptible to a received noise, and phase locking processing is protected. As a result, the phase locking processing will not fail but stable demodulation and synchronization processing can be sustained. After the processing of step S68 is completed, the process proceeds to step S69.

In contrast, if a decision is made at step S67 that the detection flag signifying that a received noise has been detected is not fed, the processing of step S68 is skipped and the process proceeds to step S69.

The pieces of processing of steps S69 to S72 are identical to those of steps S19 to S22 in FIG. 6. An iterative description will be omitted.

The foregoing process is repeated by the receiver 100 during reception of a signal.

Figure 14:
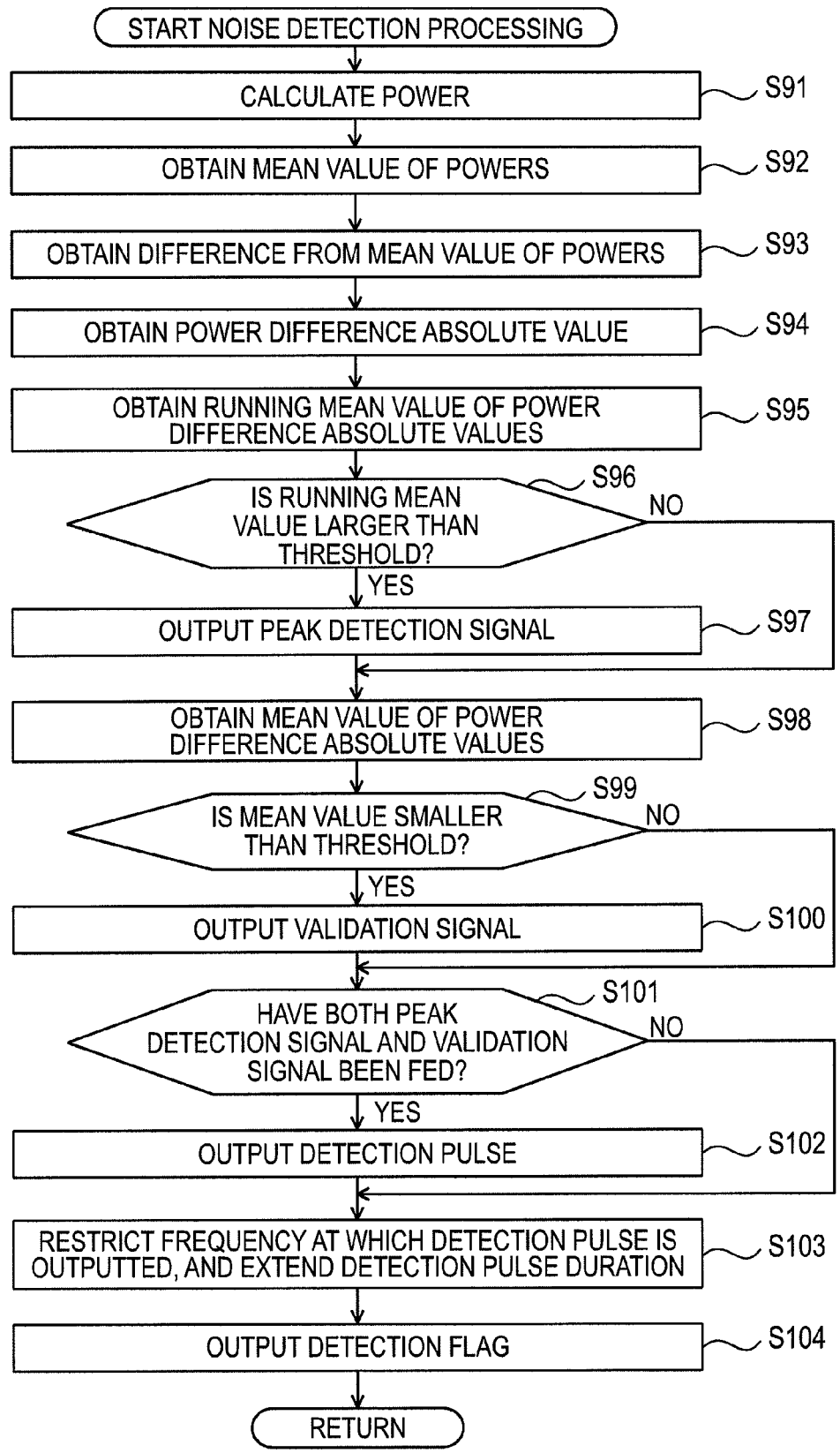
FIG. 14 is a flowchart describing noise detection processing to be performed at step S65 in FIG. 13.

Next, referring to the flowchart of FIG. 14, the noise detection processing of step S65 in FIG. 13 will be described below. Incidentally, when reception of a signal is initiated, thresholds shall be fed from the designation circuit 156 to the comparators 157 and 159.

At step S91, the power calculation circuit 151 in the noise detector 102 (FIG. 9) calculates the power of an IQ signal that is fed from the synchronization circuit 4 and that represents each symbol. At step S92, the mean circuit 152 obtains the mean value of powers fed from the power calculation circuit 151 in units of several thousands of symbols, and feeds the mean value to the arithmetic element 153.

At step S93, the arithmetic element 153 subtracts the mean value fed from the mean circuit 152 from the power of each symbol fed from the arithmetic element 173, and thus obtains the difference of the power of the symbol from the mean value.

At step S94, the absolute value arithmetic unit 154 obtains a power difference absolute value from the difference obtained by the arithmetic element 153, and feeds the power difference absolute value to each of the running mean circuit 155 and mean circuit 158. At step S95, the running mean circuit 155 obtains a running mean value of power difference absolute values fed from the absolute value arithmetic unit 154. At step S96, the comparator 157 decides whether the running mean value obtained by the running mean circuit 155 is larger than the threshold fed from the designation circuit 156.

If the comparator 157 decides at step S96 that the running mean value is larger than the threshold, the comparator 157 detects a peak of a deviation from the mean power at step S97, and outputs a peak detection signal to the AND circuit 160. The process proceeds to step S98.

In contrast, if a decision is made at step S96 that the running mean is not larger than the threshold, the processing of step S97 is skipped and the process proceeds to step S98.

At step S98, the mean circuit 158 obtains a mean value of power difference absolute values, which are fed from the absolute value arithmetic unit 154, in units of several thousands of symbols. At step S99, the comparator 159 decides whether the mean value of power difference absolute values obtained by the mean circuit 158 is smaller than the threshold fed from the designation circuit 156.

If the comparator 159 decides at step S99 that the mean value of power difference absolute values is smaller than the threshold, the comparator 159 outputs a validation signal to the AND circuit 160 at step S100. The process proceeds to step S101.

If a decision is made at step S99 that the mean value of power difference absolute values is not smaller than the threshold, the processing of step S100 is skipped. The process proceeds to step S101.

At step S101, the AND circuit 10 decides whether the peak detection signal has been fed from the comparator 157 and the validation signal has been fed from the comparator 159. If the AND circuit 160 decides at step S101 that both the peak detection signal and validation signal have been fed, the AND circuit 160 outputs a detection pulse at step S102.

In contrast, if a decision is made at step S101 that neither the peak detection signal nor validation signal has been fed, the processing of step S102 is skipped. The process proceeds to step S103.

At step S103, the detection and protection circuit 161 restricts the frequency at which the detection pulse is fed from the AND circuit 160, and extends the pulse duration of the detection pulse.

At step S104, the detection and protection circuit 161 outputs as a detection flag a signal, which results from the processing of step S103, to the amplifier 121. Noise detection processing is then terminated, and the process proceeds to step S66 in FIG. 13.

Third Embodiment

Example of the Constitution of a Receiver

Figure 15:
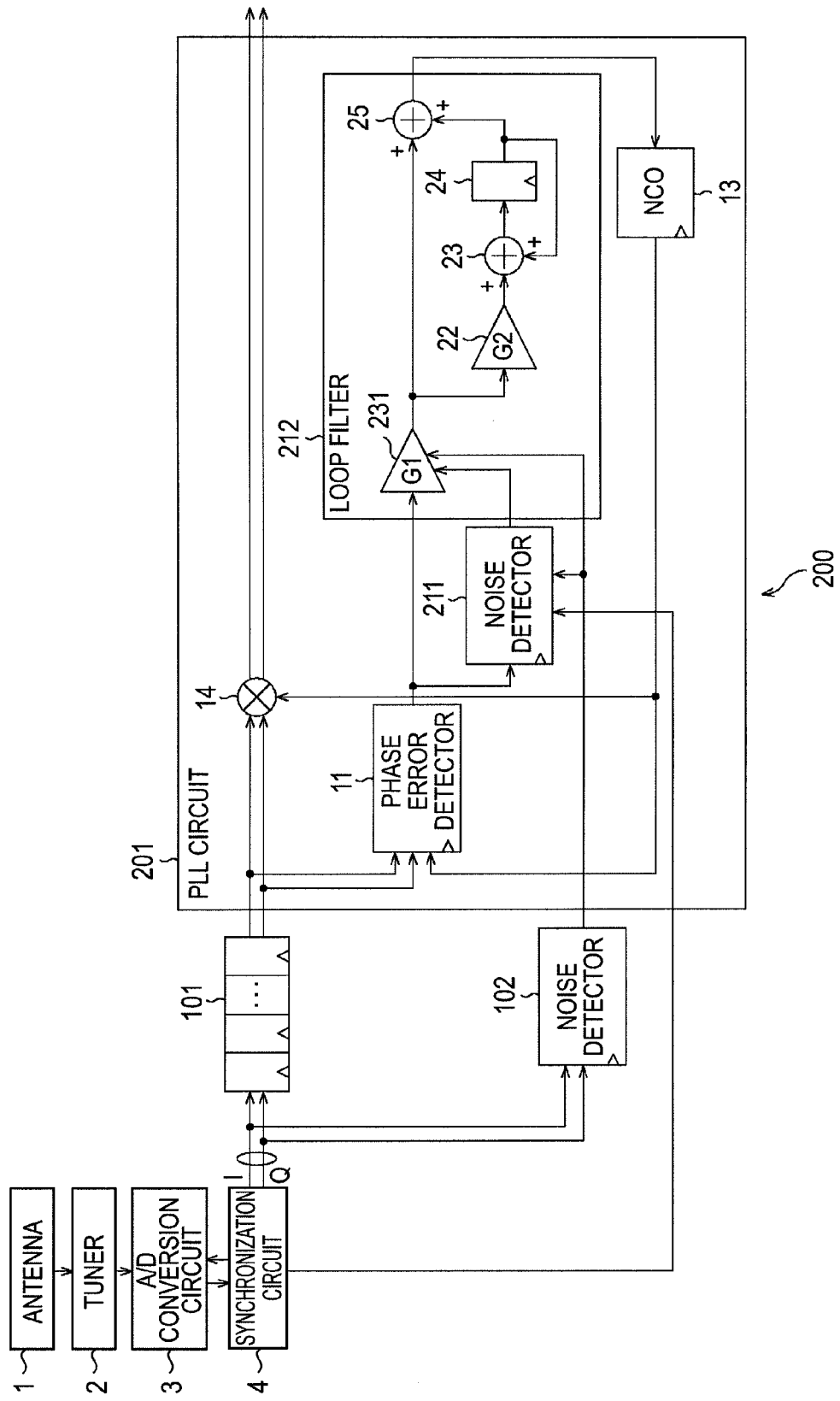
FIG. 15 is a block diagram showing an example of the constitution of the third embodiment of the receiver to which the present invention is applied.

FIG. 15 is a block diagram showing an example of the constitution of the third embodiment of a receiver to which the present invention is applied.

The constitution of a receiver 200 shown in FIG. 15 is substantially a united body of the constitutions of the receiver 40 shown in FIG. 2 and the receiver 100 shown in FIG. 8, and has the common components, which are shared by the receivers 40 and 100, used as they are.

More particularly, the constitution of the receiver 200 shown in FIG. 15 is different from the constitution shown in FIG. 1 in a point that the FIFO memory 101 and the noise detectors 102 and 211 are included, a point that a synchronization circuit 41 is substituted for the synchronization circuit 4, and a point that an amplifier 231 is substituted for the amplifier 21.

To be more specific, in the receiver 200, the noise detector 211 is connected not only to the phase error detector 11 and the amplifier 231 in a loop filter 212 but also to the noise detector 102. The noise detector 211 detects, similarly to the noise detector 51 shown in FIG. 2, a received noise by utilizing the fact that when a received noise is contained in a received signal, a phase error gets larger than it usually is.

However, when a detection flag signifying that a received noise has been detected is fed from the noise detector 102, the noise detector 211 does not detect the received noise. Therefore, the noise detector 211 may be used for long-term detection of the received noise, and the noise detector 102 may be used for short-term detection of the received noise. The reason will be described below.

As described previously, in the noise detector 102, the detection and protection circuit 161 restricts the frequency at which a detection pulse is fed. Therefore, when a received noise is detected for a long period of time, that is, when a long-term received noise is found, a detection flag does not signify that the received noise has been detected, but the noise detector 211 detects the received noise. In contrast, when the received noise is detected for a short period of time, that is, a short-term received noise is found, the detection flag signifies that the received noise has been detected. The noise detector 211 does not perform detection.

As mentioned above, in the receiver 200, the noise detector 211 that when a received noise is detected, diminishes the loop gain G1 for only a predetermined time is used to detect the long-term received noise. Phase locking processing can therefore be sustained. In contrast, if the noise detector 102 that when the received noise is detected, diminishes the loop gain G1 during the duration of a symbol is used to detect the long-term received noise, since the loop gain G1 is kept diminished, phase locking processing becomes unstable.

In the loop filter 212, the amplifier 231 modifies the loop gain G1 according to the frequency at which the detection flag signifying that a received noise has been detected is fed as a result of detection from the noise detector 211. The amplifier 231 modifies the loop gain G1 according to the detection flag which is fed as a result of detection from the noise detector 102 and which signifies that the received noise has been detected.

Owing to the foregoing constitution, the receiver 200 uses both the noise detector 211 and noise detector 102. Compared with a case where one of the noise detectors is employed, a received noise can be detected even in an environment of severer disturbance (an environment in which a phase noise is large or an environment in which a parasitic oscillation occurs). As a result, even when the received noise is found in the severer environment, stable demodulation and synchronization processing can be sustained.

(Actions to be Performed in the Receiver)

Next, actions to be performed in the receiver 200 having the foregoing constitution will be described below.

Referring to the flowchart of FIG. 16, receiving processing to be performed in the receiver 200 will be described below.

Figure 16:
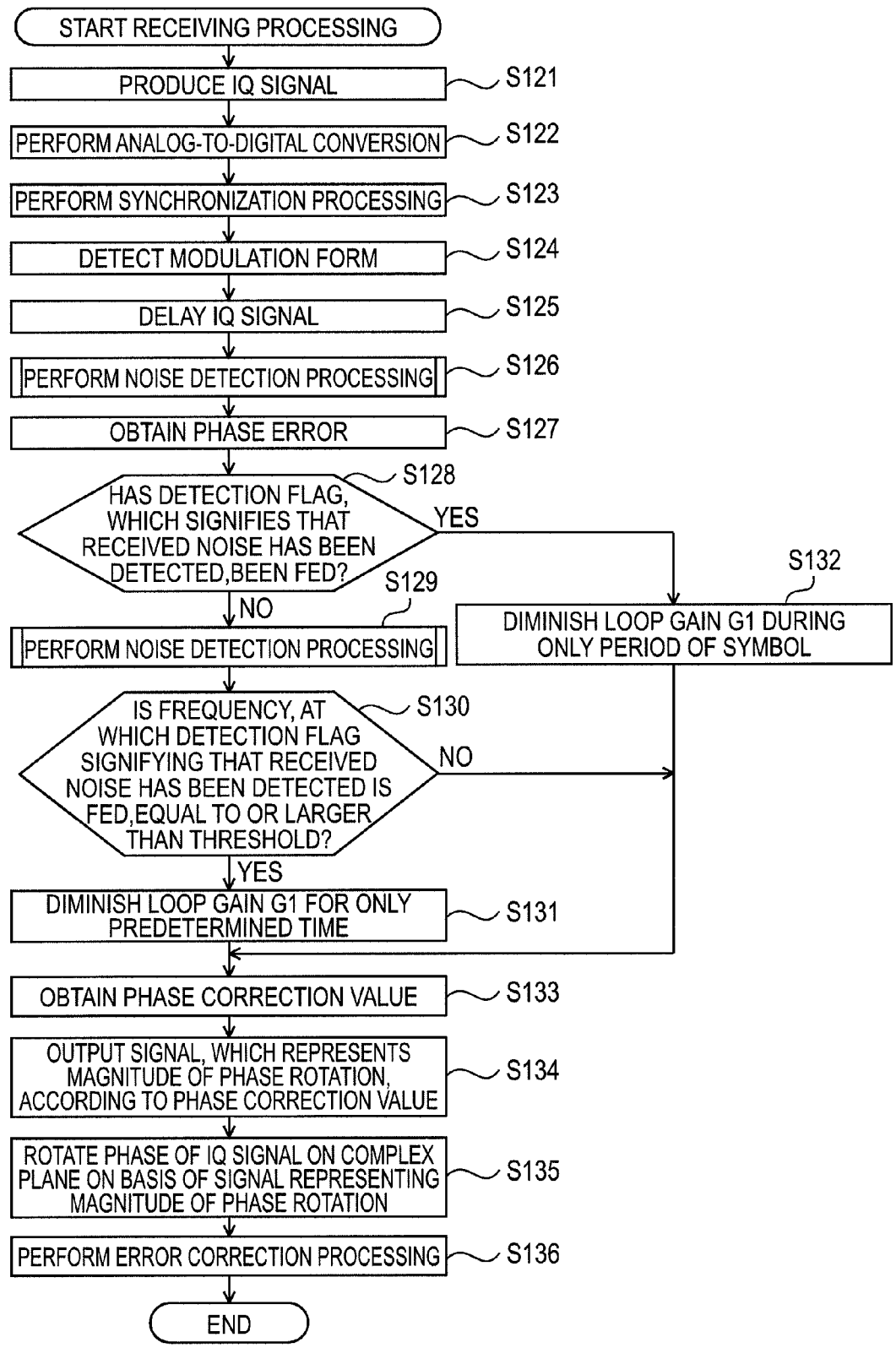
FIG. 16 is a flowchart describing receiving processing to be performed in the receiver shown in FIG. 15.

In FIG. 16, the pieces of processing of steps S121 to S124 are identical to those of steps S11 to S14 in FIG. 6. The pieces of processing of steps S125 to S127 are identical to those of steps S64 to S66 in FIG. 13. An iterative description will be omitted.

At step S128, the noise detector 211 decides whether the detection flag signifying that a received noise has been detected is fed from the noise detector 102. If the noise detector 211 decides at step S128 that the detection flag signifying that the received noise has been detected is not fed, the noise detector 211 performs noise detection processing described in FIG. 7 at step S129.

At step S130, the amplifier 231 in the loop filter 212 decides whether the frequency at which the detection flag signifying that a received noise has been detected is fed from the noise detector 211 is equal to or larger than the threshold.

If the amplifier 231 decides at step S130 that the frequency at which the detection flag signifying that a received noise has been detected is fed from the noise detector 211 is equal to or larger than the threshold, the amplifier 231 diminishes at step S131 the loop gain G1 for only a predetermined time. The process proceeds to step S133.

In contrast, if a decision is made at step S130 that the frequency at which the detection flag signifying that a received noise has been detected is fed from the noise detector 211 is not equal to or lager than the threshold, the processing of step S131 is skipped. The process proceeds to step S133.

If a decision is made at step S128 that the detection flag signifying that a received noise has been detected is fed, the amplifier 231 diminishes at step S132 the loop gain G1 for only the period of a current symbol. The process proceeds to step S133. In this case, noise detection processing by the noise detector 211 is not carried out.

The pieces of processing of steps S133 to S136 are identical to those of steps S19 to S22 in FIG. 6. An iterative description will be omitted.

The foregoing series of pieces of processing may be executed by hardware or by software. When the series of pieces of processing is executed by software, a program configured as the software is installed from a program recording medium into a computer incorporated in dedicated hardware or a general-purpose personal computer.

Figure 17:
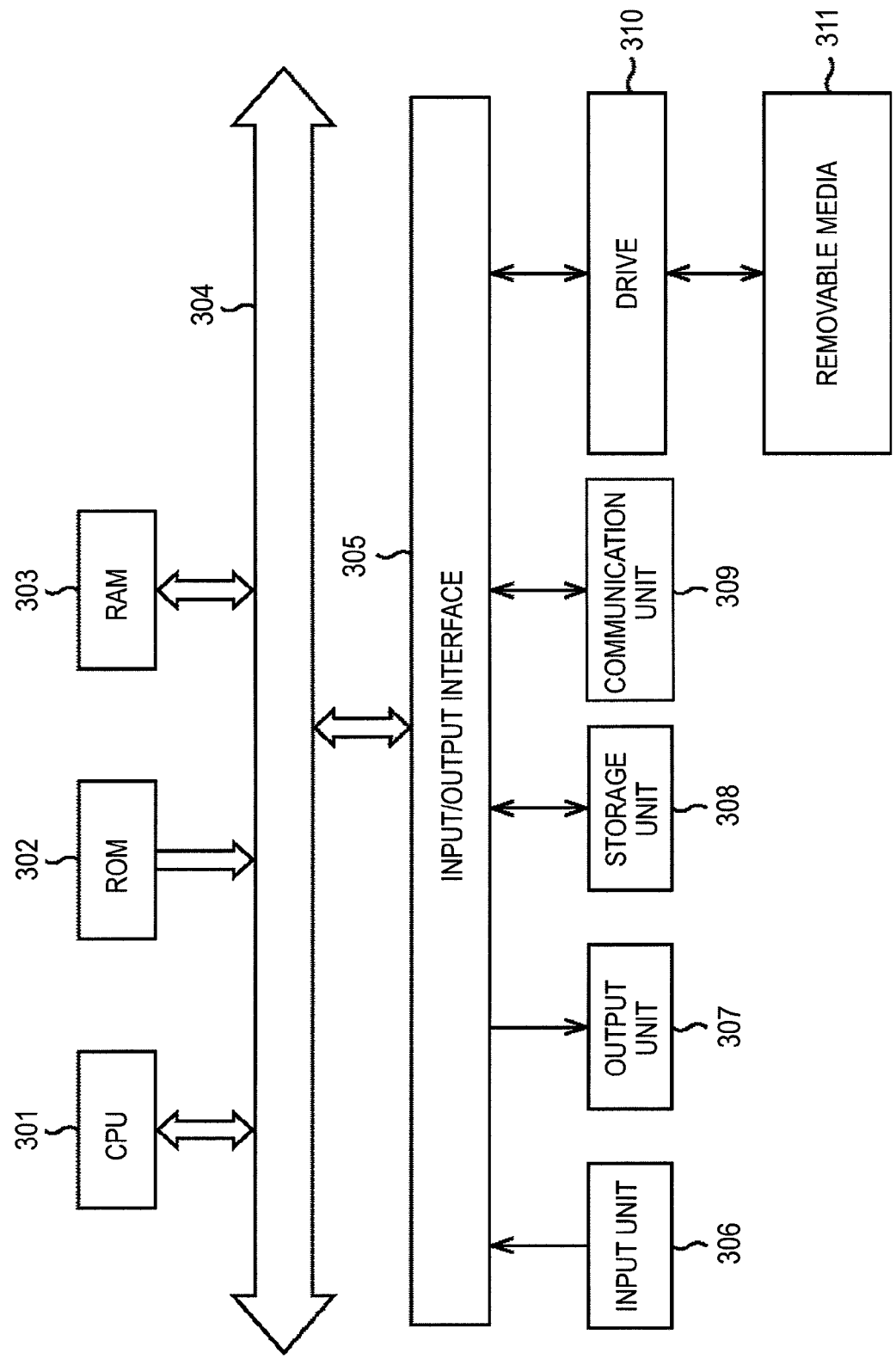
FIG. 17 is a block diagram showing an example of the hardware configuration of a computer.

FIG. 17 is a block diagram showing an example of the hardware configuration of a computer that executes the foregoing series of pieces of processing according to the program.

A central processing unit (CPU) 301, a read-only memory (ROM) 302, and a random access memory (RAM) 303 are interconnected over a bus 304.

An input/output interface 305 is connected over the bus 304. An input unit 306 including a keyboard and a mouse and an output unit 307 including a display and a loudspeaker are connected to the input/output interface 305. A memory unit 308 realized with a hard disk or a nonvolatile memory, a communication unit 309 realized with a network interface, and a drive 310 that drives a removable medium 311 are connected over the bus 304.

In the computer having the foregoing constitution, the CPU 301 loads the program, which is stored in the memory unit 308, into the RAM 303 via the input/output interface 305 over the bus 304, and runs the program, whereby the series of pieces of processing is carried out.

The program to be run by the CPU 301 is recorded in, for example, the removable medium 311, or provided via a wired or wireless transmission medium such as a local area network, the Internet, or digital broadcasting, and then installed in the memory unit 308.

The program to be run by the computer may be a program according to which pieces of processing are time-sequentially carried out in the sequence described in the present specification, or may be a program according to which pieces of preprocessing are carried out in parallel with one another or at required timings at which they are invoked.

The present invention is not limited to the foregoing embodiments but may be modified in various manners without a departure from the gist of the invention.

The present application contains subject matter related to that disclosed in Japanese Priority Patent Application JP 2008-244786 filed in the Japan Patent Office on Sep. 24, 2008, the entire contents of which is hereby incorporated by reference.

What is claimed is:

1. A receiving device comprising:
   a noise detecting means for detecting a noise, which is contained in a received signal, using the received signal which has undergone clock synchronization processing:
   a phase error detecting means for detecting a phase error of the received signal using the received signal which has undergone clock synchronization processing; and
   a calculation means for calculating a phase correction value on the basis of the phase error detected by the phase error detecting means,
   wherein, when the noise is detected by the noise detecting means, the calculation means modifies a parameter to be employed in the calculation of the phase correction value so as to decrease the phase correction value.

2. The receiving device according to claim 1, wherein the noise detecting means detects the noise using the phase error detected by the phase error detecting means.

3. The receiving device according to claim 2, wherein when the noise is detected by the noise detecting means, the calculation means modifies the parameter for only a predetermined time.

4. The receiving device according to claim 2, wherein when a modulation form for the received signal is a predetermined modulation form, the noise detecting means detects the noise using the phase error.

5. The receiving device according to claim 4, wherein the noise detecting means includes:
   a short-cycle computation means for computing a short-cycle mean value of absolute values of phase errors;
   a long-cycle computation means for computing a long-cycle mean value of absolute values of phase errors; and
   a detecting means for detecting the noise when the mean value computed by the short-cycle computation means is larger than a first threshold and the mean value computed by the long-cycle computation means is smaller than a second threshold.

6. The receiving device according to claim 1, wherein the noise detecting means detects the noise using a power of the received signal having undergone clock synchronization processing.

7. The receiving device according to claim 6, further comprising a delaying means for delaying the received signal, which has undergone clock synchronization processing, so that the phase error of the same received signal and the result of detection of the noise will be inputted to the calculation means.

8. The receiving device according to claim 7, wherein when the noise is detected by the noise detecting means, the calculation means modifies the parameter during only a period of a symbol that exhibits the phase error inputted together with the result of detection of the noise.

9. The receiving device according to claim 6, wherein the noise detecting means includes:
   a power calculation means for calculating the power of the received signal having undergone clock synchronization processing;
   a running mean means for computing a short-cycle running mean value of absolute values of differences between powers calculated by the power calculation means and a mean value of the powers;
   a mean means for computing a long-cycle mean value of absolute values of differences between the powers calculated by the power calculation means and the mean value of the powers; and
   a detecting means for detecting the noise when the running mean value computed by the running mean means is larger than a first threshold and the mean value computed by the mean means is smaller than a second threshold.

10. The receiving device according to claim 9, wherein the noise detecting means further includes a restriction means for restricting the frequency at which the noise is detected.

11. The receiving device according to claim 1, wherein:
   the noise detecting means includes:
   a first noise detecting means for detecting the noise using the phase error detected by the phase error detecting means, and a second noise detecting means for detecting the noise using a power of the received signal having undergone clock synchronization processing, the second noise detecting means restricts the frequency at which the noise is detected, when the noise is not detected by the second noise detecting means, the first noise detecting means performs detection of the noise, and when the first noise detecting means or second noise detecting means detects the noise, the calculation means modifies the parameter so as to decrease the phase correction value.

12. The receiving device according to claim 11, further comprising a delaying means for delaying the received signal, which has undergone clock synchronization processing, so that the phase error of the same received signal and the result of detection of the noise will be inputted to the calculation means, wherein, when the noise is detected by the first noise detecting means, the calculation means modifies the parameter for only a predetermined time; and
   when the noise is detected by the second noise detecting means, the calculation means modifies the parameter during only the period of a symbol which exhibits the phase error inputted together with the result of detection of the noise.

13. A receiving method comprising the steps of:
 detecting a noise, which is contained in a received signal, using the received signal which has undergone clock synchronization processing;
 detecting a phase error of the received signal using the received signal which has undergone clock synchronization processing; and
 calculating a phase correction value on the basis of the phase error detected through the processing of the phase error detection step,
 wherein at the calculation step, when the noise is detected through the processing of the noise detection step, a parameter to be employed in the calculation of the phase correction value is modified in order to decrease the phase correction value.

14. A non-transitory computer readable storage medium having stored thereon a program that causes a computer to function as a receiving device comprising:
 a noise detecting means for detecting a noise, which is contained in a received signal, using the received signal which has undergone clock synchronization processing;
 a phase error detecting means for detecting a phase error of the received signal using the received signal which has undergone clock synchronization processing; and
 a calculation means for calculating a phase correction value on the basis of the phase error detected by the phase error detecting means,
 wherein when the noise is detected by the noise detecting means, the calculation means modifies a parameter to be employed in the calculation of the phase correction value so as to decrease the phase correction value.

15. A receiving device comprising:
 a noise detecting unit configured to detect a noise, which is contained in a received signal, using the received signal which has undergone clock synchronization processing:
 a phase error detecting unit configured to detect a phase error of the received signal using the received signal which has undergone clock synchronization processing; and
 a calculation unit configured to calculate a phase correction value on the basis of the phase error detected by the phase error detecting unit, wherein, when the noise is detected by the noise detecting unit, the calculation unit modifies a parameter to be employed in the calculation of the phase correction value so as to decrease the phase correction value.

\* \* \* \* \*